United States Patent
McCracken

(10) Patent No.: US 8,918,751 B1
(45) Date of Patent: Dec. 23, 2014

(54) METHODS, SYSTEMS, AND ARTICLES OF MANUFACTURE FOR IMPLEMENTING PHYSICAL DESIGN DECOMPOSITION WITH CUSTOM CONNECTIVITY

(71) Applicant: Cadence Design Systems, Inc., San Jose, CA (US)

(72) Inventor: Thaddeus C. McCracken, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/843,706

(22) Filed: Mar. 15, 2013

(51) Int. Cl.
G06F 17/50 (2006.01)

(52) U.S. Cl.
CPC .................................. G06F 17/5072 (2013.01)
USPC ............................ 716/123; 716/124; 716/125

(58) Field of Classification Search
CPC ........................ G06F 17/5072; G06F 2217/06
USPC .......................................... 716/123, 124, 125
See application file for complete search history.

(56) References Cited

U.S. PATENT DOCUMENTS

| | | | |
|---|---|---|---|
| 5,682,322 A | 10/1997 | Boyle et al. | |
| 5,910,897 A | 6/1999 | Dangelo et al. | |
| 6,026,223 A | 2/2000 | Scepanovic et al. | |
| 7,469,143 B2* | 12/2008 | Jain et al. | 455/446 |
| 8,046,313 B2 | 10/2011 | Hoffberg et al. | |
| 8,587,102 B2 | 11/2013 | Leedy | |
| 2003/0079192 A1* | 4/2003 | Cheong et al. | 716/7 |
| 2004/0230931 A1 | 11/2004 | Barbee et al. | |
| 2007/0147269 A1* | 6/2007 | Ettle et al. | 370/254 |
| 2007/0294648 A1* | 12/2007 | Allen et al. | 716/4 |
| 2008/0216040 A1 | 9/2008 | Furnish et al. | |
| 2009/0031265 A1* | 1/2009 | Papadopoulou et al. | 716/5 |
| 2009/0254874 A1 | 10/2009 | Bose | |
| 2013/0283225 A1* | 10/2013 | Alpert et al. | 716/122 |

OTHER PUBLICATIONS

"Geometric Algorithms" URL:http://www.cs.princeton.edu/~rs/AlgsDS07/16Geometric.pdf, 2007.
"Voronoi Diagram" URL:http://mathworld.wolfram.com/VoronoiDiagram.html, 1999.
Adya, Saurabh N., and Igor L. Markov. "Fixed-outline floorplanning: Enabling hierarchical design." Very Large Scale Integration (VLSI) Systems, IEEE Transactions on 11.6 (2003): 1120-1135.
Arya et al., "Linear-Size Approximate Voronoi Diagrams" 2002.
Arya, Sunil, Theocharis Malamatos, and David M. Mount. "Space-efficient approximate Voronoi diagrams." Proceedings of the thiry-fourth annual ACM symposium on Theory of computing. ACM, 2002.

(Continued)

Primary Examiner — Vuthe Siek
(74) Attorney, Agent, or Firm — Vista IP Law Group, LLP

(57) ABSTRACT

Disclosed are methods, systems, and articles of manufactures for implementing physical design decomposition with custom conductivity by identifying custom, incomplete conductivity for an electronic design, partitioning a physical design space multiple non-overlapping cells, and iteratively moving at least some of the nodes of these multiple cells to generate a floorplan or a placement layout until one or more convergence criteria are satisfied while maintaining the custom, incomplete conductivity. The floorplan or a placement layout generated resembles the final floorplan obtained through a floorplanner or the final placement layout through a placement tool without requiring that complete conductivity information be provided to the floorplanner or placement tool.

31 Claims, 31 Drawing Sheets

(56) References Cited

OTHER PUBLICATIONS

Auber, D., et al. "Animated, Dynamic Voronoi Treemaps." 2010.
Balzer, Michael, Oliver Deussen, and Claus Lewerentz. "Voronoi treemaps for the visualization of software metrics." Proceedings of the 2005 ACM symposium on Software visualization. ACM, 2005.
Chen, Tung-Chieh, et al. "MP-trees: a packing-based macro placement algorithm for mixed-size designs." Design Automation Conference, 2007. DAC'07. 44th ACM/IEEE. IEEE, 2007.
Chen, Tung-Chieh, et al. "MP-trees: A packing-based macro placement algorithm for modern mixed-size designs." Computer-Aided Design of Integrated Circuits and Systems, IEEE Transactions on 27.9 (2008): 1621-1634.
Choi, S-G., and Chong-Min Kyung. "A floorplanning algorithm using rectangular Voronoi diagram and force-directed block shaping." Computer-Aided Design, 1991. ICCAD-91. Digest of Technical Papers., 1991 IEEE International Conference on. IEEE, 1991.
David Austin, "Voronoi Diagrams and a Day at the Beach", URL: http://www.ams.org/samplings/feature-column/fcarc-voronoi, Aug. 2006.
Non-Final Office Action dated Mar. 17, 2014 for U.S. Appl. No. 13/842,684.
Fatemeh Ahmadi Nejad Masouleh, "Constructing Weighted Voronoi Diagrams Using Computer Programs", URL:http://giswin.geo.tsukuba.ac.jp/sis/tutorial/GISHint,fatemeh.pdf, Dec. 2006.
Fruchterman, Thomas MJ, and Edward M. Reingold. "Graph drawing by force-directed placement." Software: Practice and experience 21.11 (1991): 1129-1164.
Guilherme Fonseca, "Approximate Voronoi Diagrams" Mar. 2005.
Guo, Pei-Ning, Chung-Kuan Cheng, and Takeshi Yoshimura. "An O-tree representation of non-slicing floorplan and its applications." Proceedings of the 36th annual ACM/IEEE Design Automation Conference. ACM, 1999.
Hu, Yifan. "Efficient, high-quality force-directed graph drawing." Mathematica Journal 10.1 (2005): 37-71.
Ogniewicz, R., and M. Ilg. "Voronoi skeletons: Theory and applications." Computer Vision and Pattern Recognition, 1992. Proceedings CVPR'92., 1992 IEEE Computer Society Conference on. IEEE, 1992.
Schneider, Jens, Martin Kraus, and Rudiger Westermann. "GPU-based Real-time Discrete Euclidean Distance Transforms with Precise Error Bounds." VISAPP (1). 2009.
Sud, Avneesh, Danyel Fisher, and Huai-Ping Lee. "Fast dynamic voronoi treemaps." Voronoi Diagrams in Science and Engineering (ISVD), 2010 International Symposium on. IEEE, 2010.
T. Ventimiglia et al., "The Barnes-Hut Algorithm" URL: arborjs.org/docs/barnes-hut, 2003.
Vorwerk, Kristofer, Andrew Kennings, and Anthony Vannelli. "Engineering details of a stable force-directed placer." *Proceedings of the 2004 IEEE/ACM International conference on Computer-aided design*. IEEE Computer Society, 2004.
Non-Final Office Action dated Apr. 22, 2014 for U.S. Appl. No. 13/842,791.
Non-Final Office Action dated May 9, 2014 for U.S. Appl. No. 13/843,706.
Sang-Gil Choi and Chong-Min Kyung "A Floorplanning Algorithm Using Rectangular Voronoi Diagram and Force-Directed Block Shaping", Department of Electrical Engineering, Korea Advanced Institute of Science and Technology, 1991 IEEE.
Final Office Action dated Sep. 12, 2014 for U.S. Appl. No. 13/842,890.
Meththa Samaramayake, Helen Ji, and John Ainscorgh "Force Directed Graph Drawing Algorithms for Macro Cell Placement" Proceedings of the World Congrees on Engineering 2008 vol. I.
Non-Final Office Action dated Sep. 29, 2014 for U.S. Appl. No. 13/842,791.
Final Office Action dated Aug. 28, 2014 for U.S. Appl. No. 13/842,684.

\* cited by examiner

METHODS, SYSTEMS, AND ARTICLES OF MANUFACTURE FOR IMPLEMENTING PHYSICAL DESIGN DECOMPOSITION WITH CUSTOM CONNECTIVITY

CROSS REFERENCE TO RELATED APPLICATION(S)

This application is related to U.S. patent application Ser. No. 13/842,890 entitled "METHODS, SYSTEMS, AND ARTICLES OF MANUFACTURE FOR IMPLEMENTING PHYSICAL DESIGN USING FORCE MODELS", and U.S. patent application Ser. No. 13/842,684 entitled "METHODS, SYSTEMS, AND ARTICLES OF MANUFACTURE FOR IMPLEMENTING PHYSICAL DESIGNS WITH FORCE DIRECTED PLACEMENT OR FLOORPLANNING AND LAYOUT DECOMPOSITION WITH CUSTOM CONNECTIVITY", and U.S. patent application Ser. No. 13/842,791 entitled "METHODS, SYSTEMS, AND ARTICLES OF MANUFACTURE FOR PROVIDING INTERACTIVE, CONTINUOUS FEEDBACK IN IMPLEMENTING PHYSICAL DESIGNS USING FORCE DIRECTED PLACEMENT OR FLOORPLANNING AND LAYOUT DECOMPOSITION WITH CUSTOM CONNECTIVITY", the content of the three applications is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A modern IC design, an IP (intellectual property) cell in the IC (integrated circuit) core area may communicate and exchange data with certain IP cells in the IC core area via certain part(s) in the outer I/O (input/output) ring and thus need to stay within some close proximity of the corresponding portion in the I/O ring. During the early design planning stages where design data are scarce and incomplete at best, an architect may have to determine what the fabric need to look like in order to meet various criteria, such as functional requirements, I/O conductivity or connectivity, fabric configuration, etc.

Moreover, some of the design criteria may compete with some other design criteria, and the conflicting criteria may further exacerbate the challenges. Traditional approaches typically receive, for example, the functional requirements for a design, model the design in terms of the flow of the signals and the logic operations on these signals in RTL (register transfer level), synthesize the RTL, and perform prototyping using the netlist from the synthesis. Nonetheless, such conventional approaches may not property serve prototyping, IO planning, feasibility analysis, or floorplanning in early design stages where the details of the design are lacking or to be determined. Therefore, what is needed is a method, system, and computer program product for implementing physical design decomposition with custom connectivity.

SUMMARY

Disclosed are various embodiments of methods, systems, and articles of manufactures for implementing physical design decomposition with custom conductivity. Some embodiments identify custom, incomplete conductivity for an electronic design from, for example, some user specified conductivity that requires some portion of the electronic design to communicate or exchange data with another portion of the electronic design. These embodiments may then partition a physical design space of the electronic design into a plurality of cells that are, by their nature, non-overlapping and iteratively move at least some of the nodes of the plurality of cells until one or more convergence criteria are satisfied while maintaining the custom, incomplete conductivity through the entire partitioning process. These embodiments generate a floorplan or a placement layout that resembles the final floorplan obtained through a floorplanning process or the final placement layout through the placement process without requiring or assuming that complete conductivity information is provided to the floorplanner or placement tool.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF ILLUSTRATED EMBODIMENTS

Various embodiments are directed to a method, system, and computer program product for implementing and using virtual sales process engineering. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-14.

Figure 1:
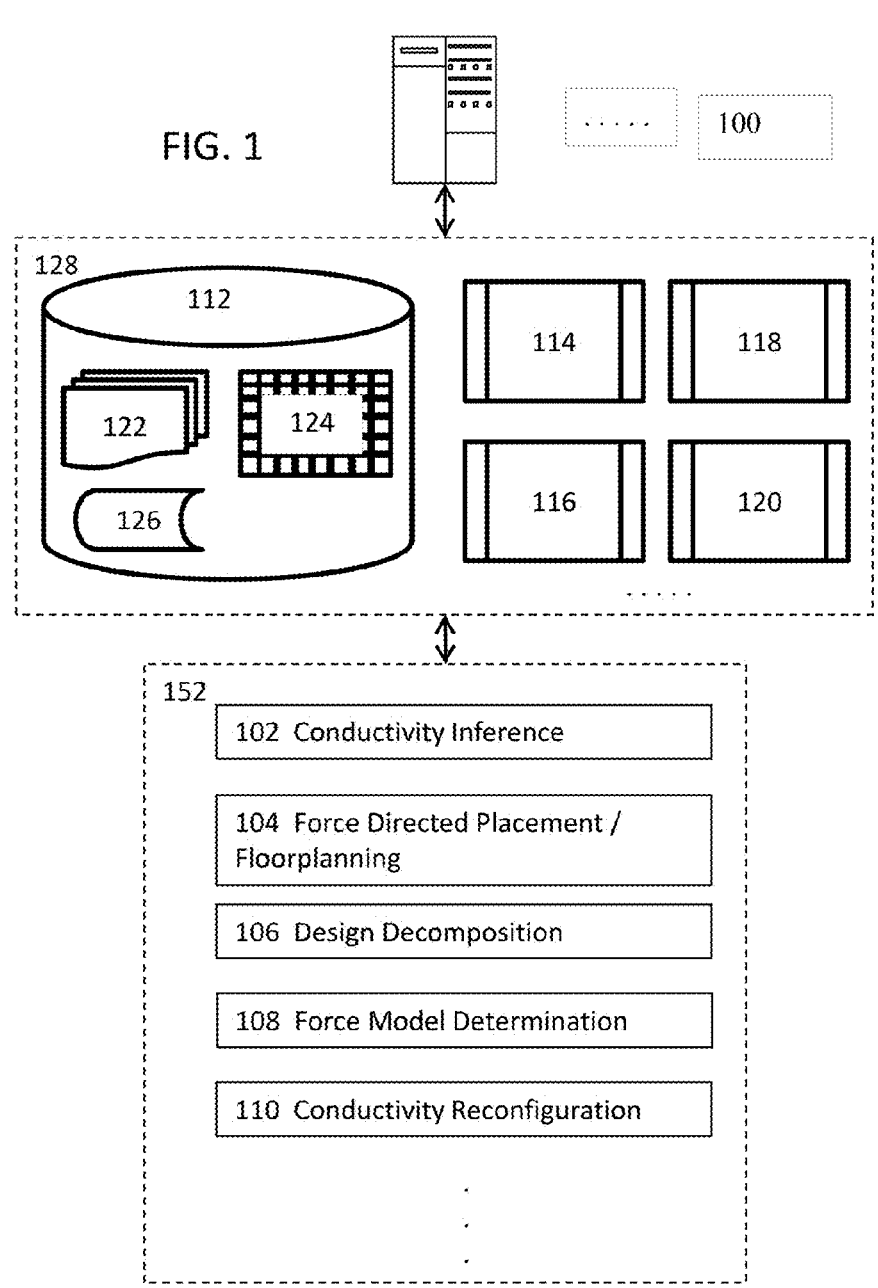
FIG. 1 illustrates a schematic representation of exemplary implementations for implementing physical design decomposition with custom connectivity in some embodiments.

FIG. 1 illustrates a high level block diagram for implementing physical design decomposition with custom connectivity in some embodiments. In one or more embodiments, the system for implementing physical design decomposition with custom connectivity may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a conductivity or connectivity (hereinafter conductivity) inference module 102 to infer conductivity for a physical design or a portion thereof, a force directed placement or floorplanning module 104 to perform the placement or floorplanning functions for the physical design or a portion thereof, a design decomposition or partitioning module 106 to partition an area of a physical design into a plurality of cells, regions, or blocks (hereinafter cells) either alone or jointly with one or more other modules, a force model determination modules 108 to determine various characteristics, parameters, variables, etc. for one or more force models, or a conductivity reconfiguration engine 110 to reconfigure some conductivity for a physical design or a portion thereof, etc.

Figure 2:
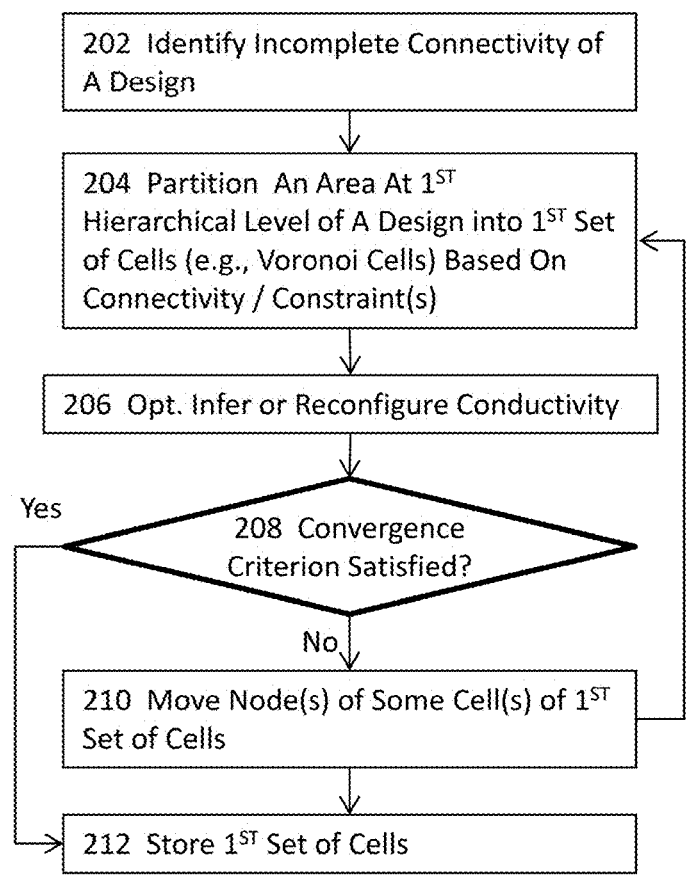
FIG. 2 illustrates a top level flow diagram for implementing physical design decomposition with custom connectivity in some embodiments.

FIG. 2 illustrates a top level flow diagram for implementing physical design decomposition with custom connectivity in some embodiments. In one or more embodiments, the method for implementing physical design decomposition with custom conductivity may comprise the process 202 of identifying custom connectivity of a design. In some embodiments, the conductivity information does not necessarily dictate how a first design block (e.g., an intellectual property or IP block or generally any group of electronic design components of an electronic design) is precisely connected to other blocks. Rather, the conductivity information may merely indicate that the first design block communicates with (e.g., exchanging data) or and is thus somehow connected to these other blocks. That is, the conductivity information does not necessarily specify, for example, which port of one design block is to be connected to another port of another design block but simply indicates that a design block communicates to another design block. It shall be noted that the terms conductivity and connectivity are used interchangeably, unless otherwise specifically recited or claimed.

For example, the conductivity information for an electronic design may simply indicate or require that the design block representing the CPU is to be connected to another design block representing the IO (input/output) bus without specifying, for example, which pins, terminals, or pads in the CPU are to be connected to the pins, terminals, or pads of the IO bus. In some of the one or more embodiments, the custom conductivity contains only incomplete conductivity without providing complete conductivity information for the entire design.

As another example, the custom conductivity may contain only the conductivity information that specifies a first cell to be connected to a first IO cell, a second cell to be connected to a second IO cell, and a third cell to be connected to a fourth cell, while leaving all the remaining cells in the design unspecified in these embodiments. In other words, various processes and modules described herein do not require or assume the conductivity information provided to these various processes or modules is complete and can operate on the design to achieve their respective intended purposes with only the incomplete conductivity. In some embodiments, the custom conductivity identified at 202 comprises user specified conductivity.

In some embodiments, the method may comprise the process 204 of partitioning an area at a first hierarchical level of the design into a first set of cells, each containing a node, based at least in part upon the custom conductivity. In these embodiments, each cell in the first set of cells may be used for placement or floorplanning of electronic design components. Moreover, one of the advantages of these embodiments is that the conductivity information identified at 304 is used in process 306 to partition the core area of the design, and thus the partitioning of the cells and hence the final floor plan or the placement layout maintains or observes the conductivity information.

For example, a customer may approach foundry or a design house to design an electronic circuit, and the customer may require that certain cells are to be connected to some other cells in the electronic design while leaving the remainder of the electronic design to be designed and implemented by the foundry or design house. The foundry or the design house may then use the approaches described herein to present a floorplan or a placement layout that will resemble the final floorplan or the final placement layout without actually completing the electronic design.

In addition, the more conductivity information that is provided to various processes described here, the more closely the initial floorplan or placement layout produced by various embodiments described herein resembles the final, completed floorplan or placement layout of the electronic design because the custom conductivity information is used in driving the partitioning of the layout area and is thus maintained or observed throughout the entire design process. In other words, various approaches described herein provide a designer the capability of presenting a floorplan or placement layout that resembles the final floorplan or placement layout without requiring the designer to actually complete the floorplanning or placement process. Another advantage of this approach is that a designer may provide a quick floorplan or placement layout that resembles the final floorplan or placement obtained through the entire floorplanning or placement process for quick evaluation such as a feasibility evaluation, without actually having to complete the floorplanning or placement process.

In some embodiments, the first set of cells comprise a plurality of Voronoi cells or Voronoi polygons (hereinafter Voronoi cell or Voronoi cells). More specifically, a Voronoi cell constitutes a polygon whose interior includes all points in the plane which are closer to a particular point (e.g., a node that is used to construct the Voronoi cell) than to any other.

Some embodiments thus partition a physical design space into a Voronoi diagram including a plurality of Voronoi cells. Voronoi cells are thus convex polygons and non-overlapping. Therefore, one of the advantages of these embodiments is that partition a physical design space into a plurality of Voronoi cells is that these cells do not overlap, and thus these embodiments need not solve or resolve the overlapping problems between two or more cells that have existed in many conventional partitioning approaches. Various embodiments use the Voronoi decomposition process to partition a physical design space having n Voronoi generation nodes into convex polygons—the Voronoi polygons or Voronoi cells—such that each cell contains exactly one Voronoi generation node and every point in a given Voronoi cell is closer to the Voronoi generation node of the given Voronoi generation cell than to any other Voronoi generation nodes. Furthermore, a Voronoi cell contains exactly one generation point (e.g., the node used to generate the Voronoi cell). Therefore, various embodiments first identify or generate a number of nodes and then use the number of nodes to generate the Voronoi cells. More details about partitioning a physical design space into Voronoi cells will be provided in subsequent paragraphs with reference to the appropriate figures.

In some embodiments, the method may optionally comprise the process 206 of inferring or reconfiguring conductivity. In some of these embodiments, the process 206 may infer or reconfigure conductivity based at least in part upon the decomposed physical design area at the first hierarchical level of the design. More details about reconfiguring and inferring conductivity will be provided in subsequent paragraphs with reference to the appropriate drawing figures. In some embodiments, the method may comprise the process 208 of determining whether the first set of cells satisfies one or more convergence or stopping criteria.

In some embodiments, the one or more convergence or stopping criteria include, for example but not limited to, achieving a minimal or sufficient low energy state, whether each cell in the first set of cells is sufficiently close to one or more target cell sizes, whether the standard deviation of the sizes of the cells from one or more target cell sizes in the first set is below some prescribed threshold level, whether the wire lengths are within some threshold number, or whether the first hierarchical level of the design based on the first set of cells meets some timing requirements, etc. In some of these embodiments where the first set of cells satisfies the one or more convergence or stopping criteria, the method may proceed to 212 to store the first set of cells in volatile memory (e.g., 1808) or non-volatile memory (e.g., 128 or 1832).

In some embodiments, the method may comprise the process 210 of moving some nodes, each belonging to a cell in the first set, of the first set of cells by using one or more models. In some embodiments, the one or more models comprise one or more attractive force models, one or more repulsive force models, or combinations thereof. More details about the one or more models are described in U.S. patent application Ser. No. 13/842,890 entitled "METHODS, SYSTEMS, AND ARTICLES OF MANUFACTURE FOR IMPLEMENTING PHYSICAL DESIGN USING FORCE MODELS WITH CUSTOM CONNECTIVITY", the content of which is hereby incorporated by reference in its entirety for all purposes. In some embodiments, the one or more models comprise a perturbation model that introduces a small amount of perturbation to some nodes and determines whether the first set of cells with the perturbation meets one or more criteria such as a criterion for requiring minimizing or reducing the potential energy of the area of the design to a certain level. In some embodiments, the one or more models include a pressure based model. In some embodiments, the method may return to 204 to re-partition the area with the moved nodes and repeat the processes 206-208 until the first set of cells satisfies the one or more convergence criteria.

Figure 3:
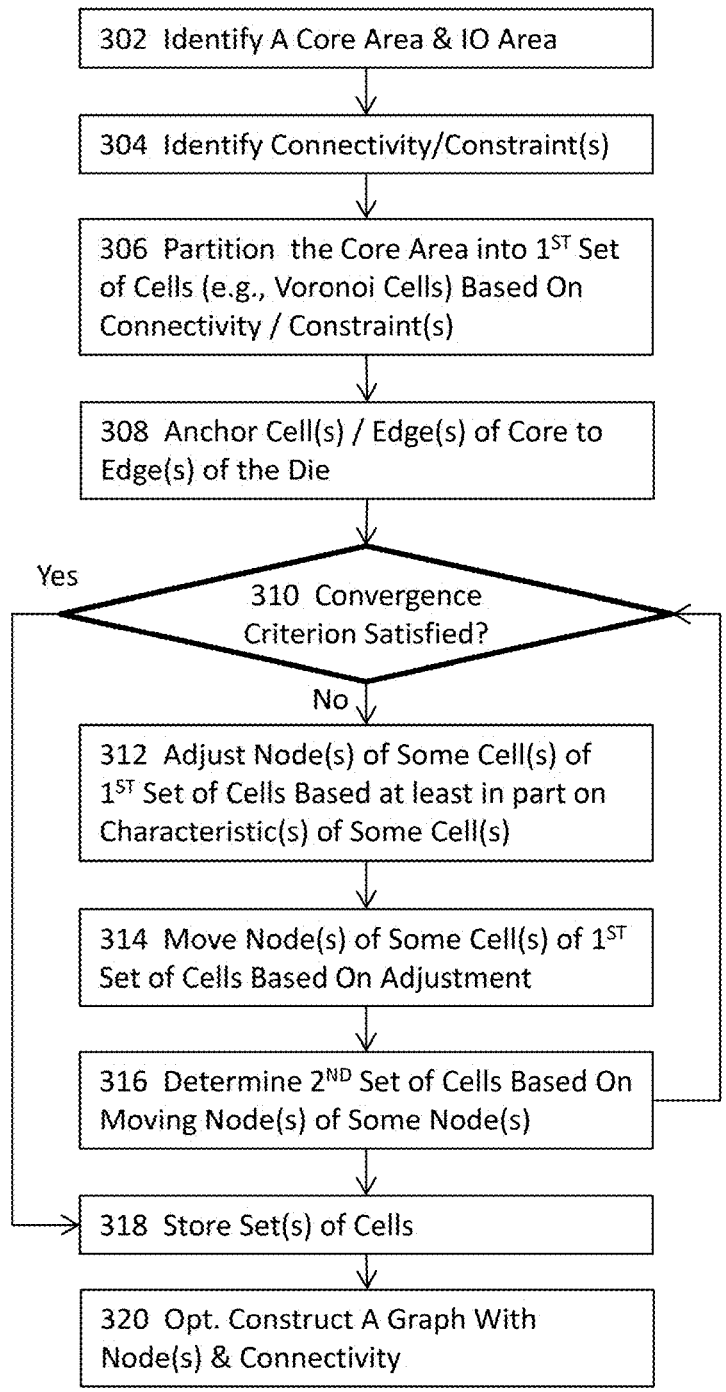
FIG. 3 illustrates more details about a top level flow diagram for implementing physical design decomposition with custom connectivity in some embodiments.

FIG. 3 illustrates more details about a top level flow diagram for implementing physical design decomposition with custom connectivity in some embodiments. In one or more embodiments, the method for implementing physical design decomposition with custom connectivity may comprise the process 302 of identifying a core area and an IO area completely or substantially surrounding or enclosing the core area of a die (e.g., an electronic design.) In some embodiments, the method may comprise the process 304 of identifying conductivity information. In some of these embodiments, the conductivity information includes user specified conductivity similar to that described for 202.

In some embodiments, the method may comprise the process 306 of partitioning the core area into a first set of cells, each containing a node, based at least in part upon the conductivity information identified at 304. In some embodiments, the first set of cells comprise a plurality of Voronoi cells. In some embodiments, the total number of cells into which a design is to be partitioned is known in advance. That is, the partitioning process (e.g., 306 or 204) partitions an area of a design into a given number of cells while observing some custom conductivity and satisfying one or more criteria such as one or more of those described with reference to 208. In some embodiments, the method may comprise the process 308 of anchoring one or more edges or cells at the edges of the core area to one or more edges of the die while observing or maintaining the conductivity information identified at 304.

Figure 14A:
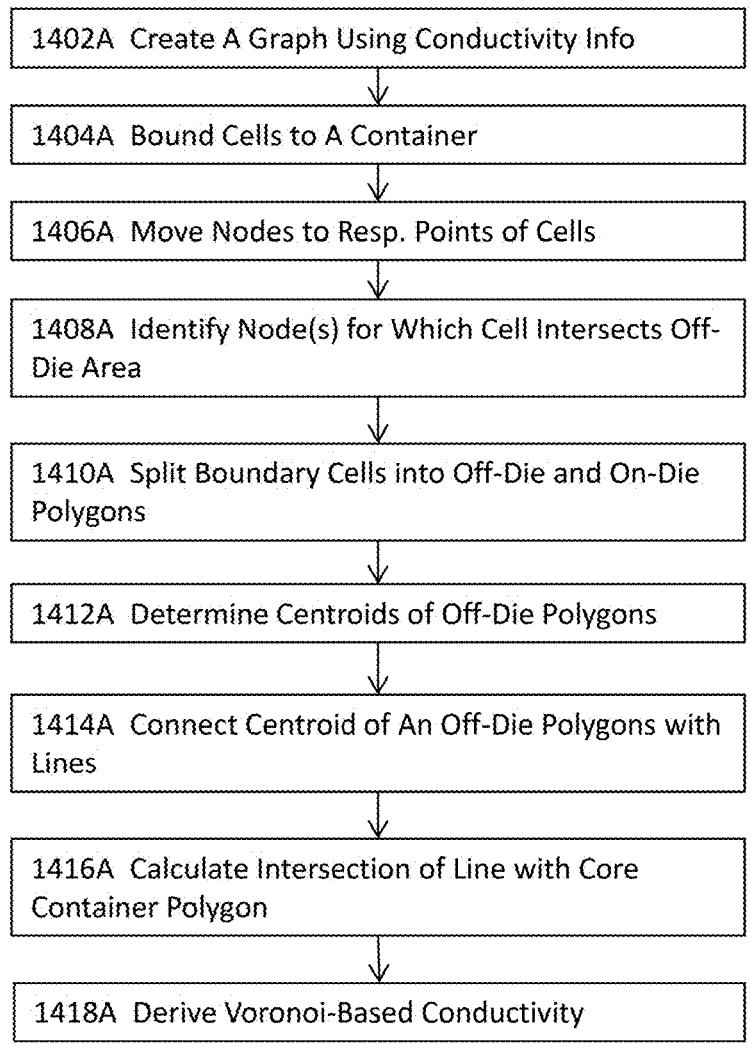
FIGS. 14A-I illustrate an exemplary process and graphical illustrations of anchoring a cell by using one or more containers in some embodiments.
Figure 14B:
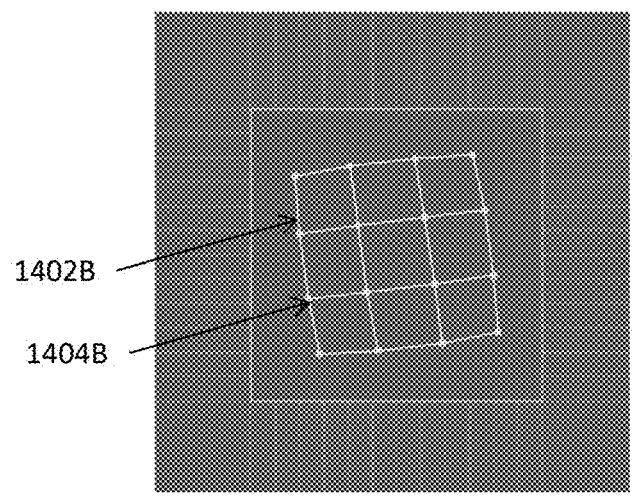

In some embodiments, the process 308 may anchor an edge or a cell at the edge by using, for example, a substantially similar process as that described for FIG. 14A. For example, the process 308 may work with a force directed placement engine to define the boundary of an IO cell in the IO area as a container and use an attractive force model between the IO cell and the cell to impose the conductivity between the cell and the IO cell in some of these embodiments. In some embodiments, the process 308 anchors the cells neighboring one or more edges of the core area to at least a part of the IO area (e.g., some IO cells in the IO area.) In some embodiments, the process 308 may anchor the cells neighboring one or more edges of the core area to the corresponding cells in the IO area based at least in part upon one or more criteria that may include, for example but not limited to, wire length requirement(s), timing requirement(s), cell area requirement (s), etc.

In some embodiments, the method may comprise the process 310 of determining whether the first set of cells satisfies one or more convergence or stopping criteria in a substantially similar manner as that described for 208. In some of these embodiments where the process 310 determines that the first set of cells satisfies the one or more convergence or stopping criteria, the method may proceed to 318 to store the first set of cells in a substantially similar manner as that described for 212. In some embodiments where the process 310 determines that the first set of cells does not satisfy the one or more convergence or stopping criteria, the method may further comprise the process 312 of adjusting one or more nodes of one or more cells in the first set of cells based at least in part upon one or more characteristics of the corresponding one or more cells.

In some embodiments where one or more force models are used to move the one or more cells, the process 312 adjusts the one or more nodes based at least in part upon how much attractive force or repulsive force a given node in the one or more nodes is to be associated with. The one or more characteristics may include, for example but not limited to, the actual area of each of the one or more cells corresponding to the one or more nodes being adjusted, the number of neighboring cells sharing a common edge with a specific cell, etc. In some embodiments, the method may comprise the process 314 of moving the one or more nodes based at least in part upon the adjustment from 312.

In some embodiments, the process 314 moves the one or more nodes by using one or more models in a substantially similar manner as that described for 210 of FIG. 2. In some embodiments, the method may comprise the process 316 of determining a second set of cells based at least in part upon the result of moving the one or more nodes, and the method loops back to 310 to re-determine whether the second set of cells meets the one or more convergence or stopping criteria. The method may then iterates through 310-316 until the second set of cells meets the one or more convergence or stopping criteria where the method proceed to 318 as described above.

In some embodiments, the method may optionally comprise the process 320 of constructing a graph using the nodes in the second set of cells and the conductivity information. In some embodiments, each cell is represented in the graph as a node, and an edge connecting two nodes in the graph indicates that the two cells corresponding to the two connected nodes share a common cell boundary. In some embodiments, the method may further use the graph in the force directed placement or floorplanning module 104.

Figure 4:
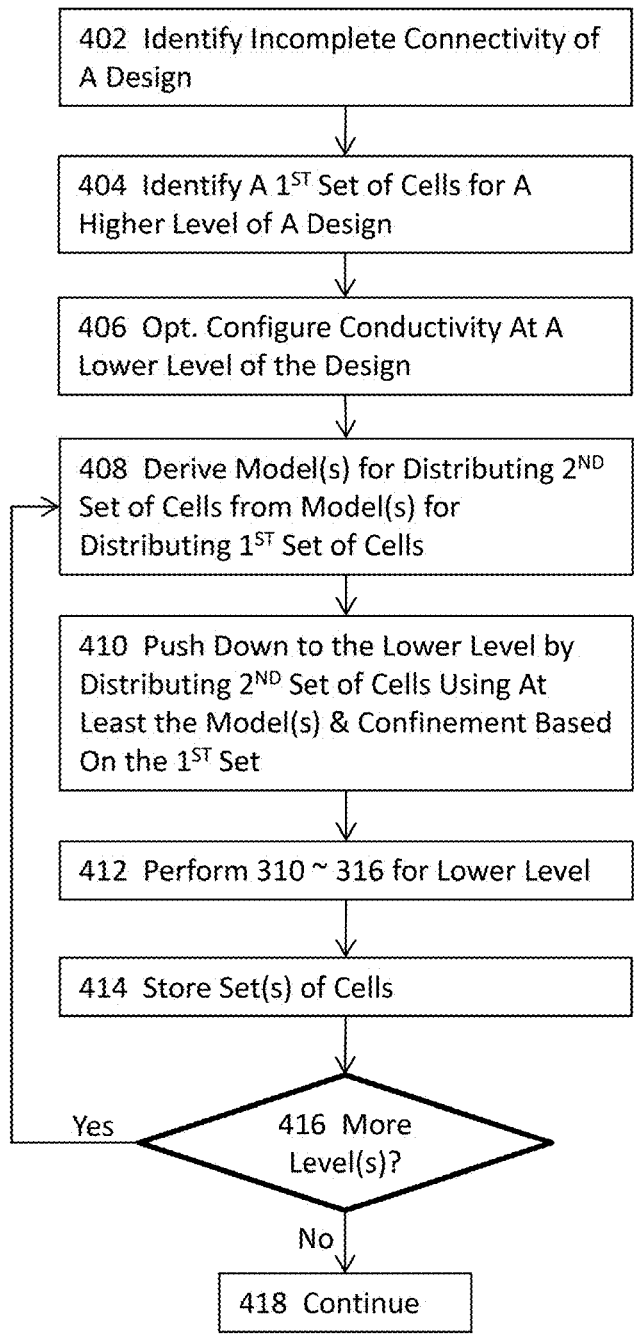
FIG. 4 illustrates a top level flow diagram for implementing multi-hierarchy physical design decomposition with custom connectivity in some embodiments.

FIG. 4 illustrates a top level flow diagram for implementing multi-hierarchy physical design decomposition with custom connectivity in some embodiments. In some embodiments, the method may comprise the process 402 of identifying incomplete conductivity information for a design such as an electronic design. The method may further include the process 404 of identifying a first set of cells at a higher hierarchical level of the design. In some embodiments, the first set of cells include a plurality of Voronoi cells. In some embodiments, the higher hierarchical level denotes the top hierarchical level of the design that includes the coarsest level of details of the designs.

In some embodiments, the method may optionally comprise the process 406 of configuring or reconfiguring conductivity for a lower hierarchical level of the design. In some of these embodiments, the process 406 may use the incomplete conductivity identified at 402 and configure or reconfigure the incomplete conductivity of the design based at least in part upon the first set of cells identified at 404. More details about configuring or reconfiguring conductivity will be described in subsequent paragraphs. In some embodiments, the method may optionally comprise the process 408 of determining or deriving one or more models for distributing the second set of cells from the corresponding one or more models used for distributing the nodes in the first set of cells at the higher hierarchical level.

In some embodiments where one or more attractive or repulsive force models are used for distributing the nodes, process 408 determines or derives the one or more attractive or repulsive force models for the lower hierarchical level from the one or more attractive or repulsive force models for the higher hierarchical level. In some embodiments, process 408 determines or derives the one or more models for the lower hierarchical level based at least in part upon the total number of nodes at the higher hierarchical level, the total number of nodes at the lower hierarchical level, or both. More details about determining or deriving one or more models for a lower hierarchical level from the corresponding one or more models for a higher hierarchical level are described in U.S. patent application Ser. No. 13/842,890 entitled "METHODS, SYSTEMS, AND ARTICLES OF MANUFACTURE FOR IMPLEMENTING PHYSICAL DESIGN USING FORCE MODELS WITH CUSTOM CONNECTIVITY", the content of which is hereby incorporated by reference in its entirety for all purposes.

In some embodiments, the method may comprise the process 410 of pushing down to the lower hierarchical level by distributing the second set of cells. In some embodiments where the one or more models are determined or derived at 408, process 410 may distribute the second set of cells by using at least the one or more models determined or derived for the lower hierarchical level. In some embodiments, process may also examine each cell at the higher hierarchical level, determine the total number of nodes at the lower hierarchical level for each cell by examining the hierarchies of the design, and distribute the total number of nodes either randomly or uniformly around the node at the higher hierarchical of each cell (where a cell contains one node) at a distance from the node.

For example, if a parent cell has a parent node at the higher hierarchical level and is to include five sub-cells at the lower hierarchical level, process 410 may, for example, identify the shortest distance from the parent node to the edges of the parent cell and distribute the five nodes of the five sub-cells along an imaginary circle having its center at the parent node and a radius of the shortest distance. In this example, the five nodes of the five sub-cells at the lower hierarchical level are confined within the parent cell and thus maintains the hierarchies of the design. In some embodiments, process may randomly distribute the child nodes in their parent cell so long as the child nodes are confined within the boundaries of the parent cell.

In some embodiments where child nodes are added to a parent cell without the requirement of having differently sized regions, the child nodes may be randomly distributed in the physical design space if one or more convergence or stopping criteria include a target area criterion. In some embodiments, the method may comprise the process 412 of performing processes 310~316 of FIG. 3 for the lower hierarchical level until the set of cells at the lower hierarchical level satisfies one or more convergence or stopping criteria in a substantially similar manner as that described for FIGS. 2-3. In some embodiments, the method may comprise the process 414 of storing the set(s) of cells that include the first set of cells at the higher hierarchical level or the set of cells at the lower hierarchical level. In some embodiments, the method may comprise the process 416 of determining whether the design includes another hierarchical level to be processed. If so, the method returns to process 408 and repeats the processes 408~414. If process 416 determines that all hierarchical levels of the design have been processed, the method may store set(s) of cells at 414 and proceed to 418 to continue.

Figure 5:
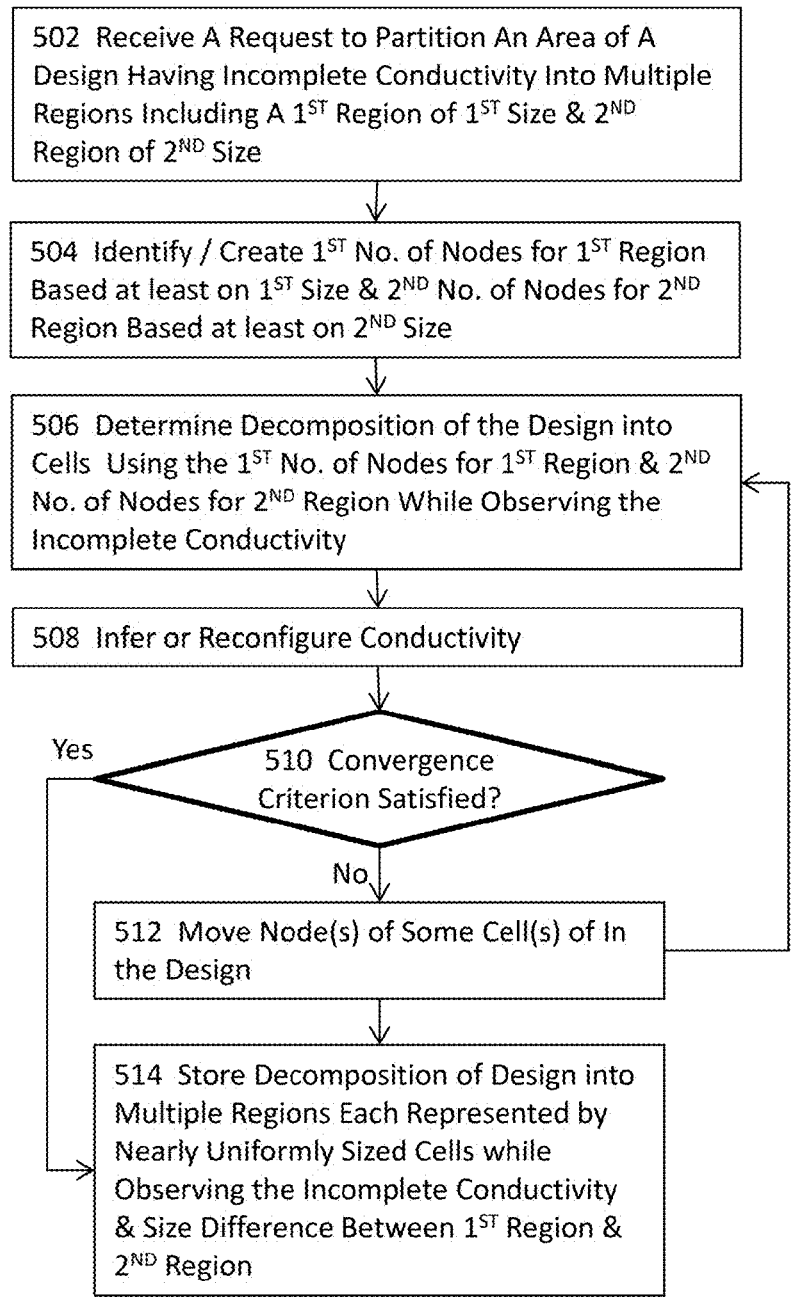
FIG. 5 illustrates a top level flow diagram for implementing physical design decomposition with custom connectivity with prescribed size differences between some regions in a physical design in some embodiments.

FIG. 5 illustrates a top level flow diagram for implementing physical design decomposition with custom connectivity with prescribed size differences between some regions in a physical design in some embodiments. In some embodiments where a target area criterion is imposed as one of the one or more convergence or stopping criteria, the cells generated in FIGS. 3-4 have areas that approximate the target area. FIG. 5 illustrates an approach to partition a physical space of a design into multiple regions, each having one or more cells through the partitioning processes described herein, where there exist size differences between two regions. For example, there may exist a requirement that the size of a first region of a design is five times that of a second region of the design.

In some embodiments, the method illustrated in FIG. 5 may comprise the process 502 of receiving a request to partition an area of a design having incomplete conductivity information into multiple regions that includes a first region of a first size and a second region of a second size. In some embodiments, the method may comprise the process 504 of identifying or creating a first number of nodes for the first region based at least in part on the first size and a second number of nodes for the second region based at least in part on the second size. In the above example where the first region is to have a size that is five times as large as that of the second region, process 504 may identify or create the second number of nodes for the second region and five times as many nodes for the first region.

In some embodiments, the method may comprise the process 506 of partitioning the design into cells using the first number of nodes for the first region the second number of nodes for the second region while observing or maintaining the incomplete conductivity by using various processes described for FIGS. 2-4 above. In some embodiments, the method may optionally comprise the process 508 of infer or reconfigure conductivity based at least in part upon the partitioned design. More details about configuring conductivity will be provided below with reference to appropriate drawing figure(s).

In some embodiments, the method may comprise the process 510 of determining whether or not the partitioned design having a set of cells satisfies one or more convergence or stopping criteria in a substantially similar manner as that described for 208 or 310. In some embodiments, the method may comprise the process 512 of moving some nodes of the set of cells in a substantially similar manner as that described for 210, 312, or 314. In some embodiments, the method may comprise the process 514 of storing the decomposition of design into multiple regions, each of which represented by nearly uniformly sized cells, while observing or maintaining the incomplete conductivity and the size difference between the first region and the second region. An illustrative example of the application of the processes illustrated in FIG. 5 may be found in FIGS. 13A-H where the final floor plan or placement layout as shown in FIG. 13H illustrates that the first region 1304H is five times as large as the second region 1302H.

Figure 6:
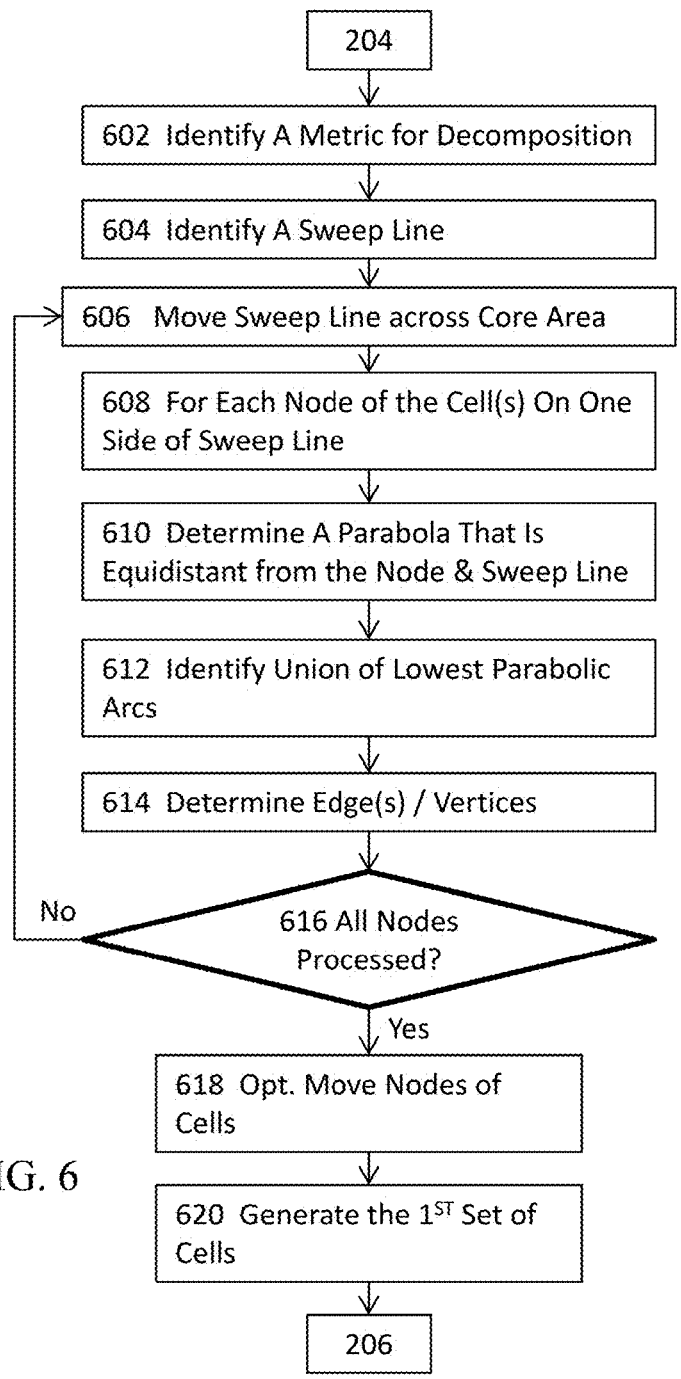
FIG. 6 illustrates more details about the top level flow diagram for implementing physical design decomposition with custom connectivity illustrated in FIG. 2 in some embodiments.

FIG. 6 illustrates more details about the top level flow diagram for implementing physical design decomposition with custom connectivity illustrated in FIG. 2 in some embodiments. In some embodiments the process 204 of partitioning an area at a first hierarchical level of the design into a first set of cells may comprise the process 602 of identifying a metric for decomposition of a physical design area into a plurality of cells. In some embodiments, the method may comprise the process 604 of identifying a sweep line and the process 606 of moving the sweep line from one end of the core area across the core area of a design to the other end of the core area until the sweep line sweeps through the entire area of the core area.

A sweep line may comprise a straight or curved line segment that spans across the area of interest in some embodiments. In this exemplary implementation illustrated in FIG. 6, a sweep line may comprise a straight line segment that spans across the entire width or the entire length of the core area simply for the ease of subsequent calculations. The process 606 may move the sweep line in any direction that is parallel to the normal direction of the sweep line to uncover the decomposed or partitioned physical design space. In this exemplary implementation, the process 606 may move the sweep line across the design in either a horizontal (where the sweep line constitutes a vertical line spanning across the length of the core area) or a vertical (where the sweep line constitutes a horizontal line spanning across the width of the core area) direction.

In some embodiments, the method may comprise the process 608 of identifying a node on one side (the side that has been swept by the sweep line) of the sweep line and the process 610 of determining a parabola that is equidistant from the node and the sweep line. Every time when the sweep line passes a node, the process 610 generates a new parabola. Furthermore, the parabolas change as process 606 continues to move the sweep line across the core area because a parabola represents the collection of points that are equidistant from the moving sweep line and a node.

As process 606 continues to move the sweep line across the core area, more nodes are uncovered in the area that has been swept by moving the sweep line. Therefore, the method illustrated in FIG. 6 loops through 606~610 until the sweep line has swept across the entire core area of the design. In some embodiments, the method may comprise the process 612 of identifying a union of the lowest parabolic arcs as process 606 continues to move the sweep line across the core area.

In some embodiments, the union of the lowest parabolic arcs may be called a beach line. An intersection of two parabolas may be called a break point. As process 606 continues to move the sweep line across the core area, a break point moves continuously along an edge of the diagram until a parabolic arc disappears or shrinks to a one-dimensional point. The point where a parabolic arc shrinks to a one-dimensional point is called a vertex representing a point where two edges of a cell join in the decomposed design. In other words, a vertex of a cell in the decomposed design may be identified as the intersection of three parabolic arcs (including the degenerated parabolic arc that degenerates to a one-dimensional point) and is thus equidistant from three nodes in the design.

In some embodiments, the method may comprise the process 614 of determining one or more edges or one or more vertices as process 606 continues to move the sweep line across the core area. An edge is formed between two break points formed by two parabolas and thus moves as process 606 continues to move the sweep line. In some embodiments, the method may comprise the process 616 of determining whether or not all the nodes have been processed in the core area of the design. If not, then the method may continue to move the sweep line until to sweep line sweeps through the entire area of the core area.

Once the sweep line sweeps across the entire area of the core area and all the nodes are thus processed, all the edges and vertices will be identified and thus the core will be decomposed in to a plurality of cells having a number equal to the total number of nodes. In some embodiments, the method may optionally comprise the process 618 of moving some nodes of the plurality of cells created by processes 606~616 in a substantially similar manner as that described for 210, 314, or 512. In some embodiments, the method may comprise the process 620 of generating a first set of Voronoi cells by using the edges and vertices determined above. The method may then proceed to 206.

Figure 7:
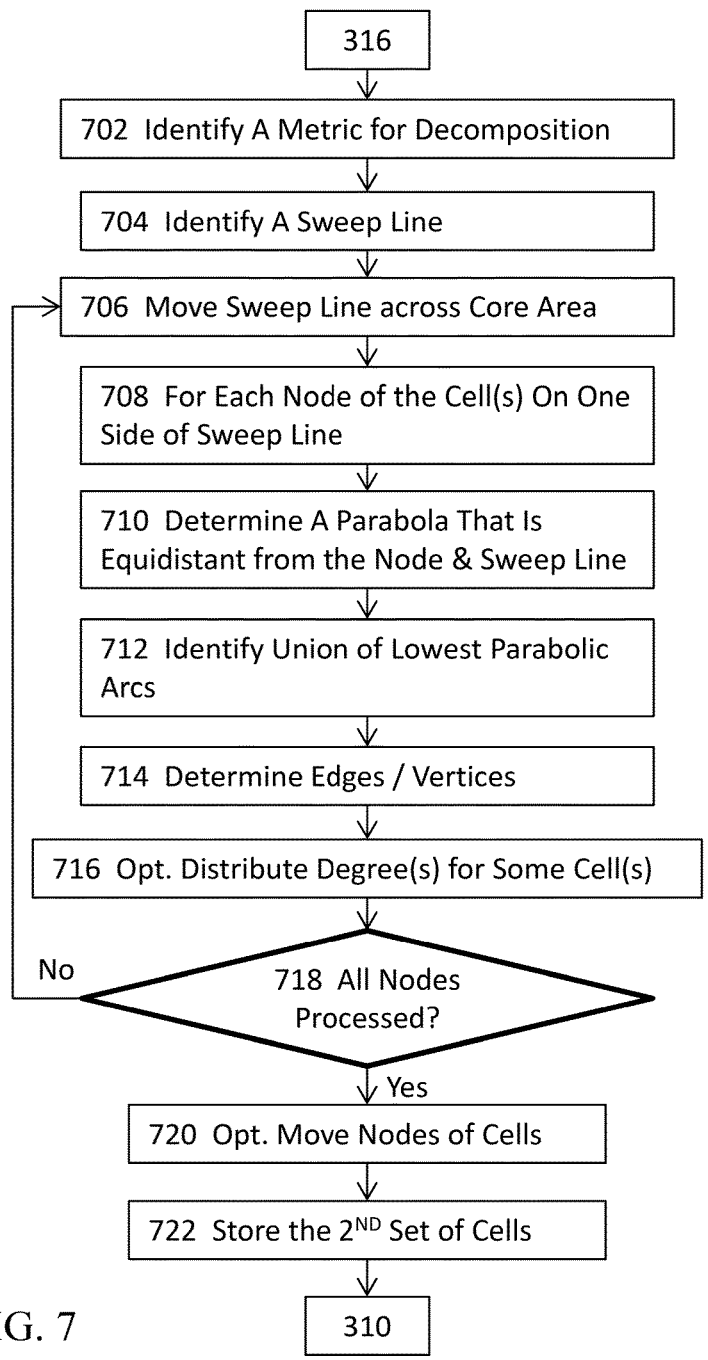
FIG. 7 illustrates more details about the top level flow diagram for implementing physical design decomposition with custom connectivity illustrated in FIG. 3 in some embodiments.

FIG. 7 illustrates more details about the top level flow diagram for implementing physical design decomposition with custom connectivity illustrated in FIG. 3 in some embodiments. More specifically, FIG. 7 illustrates more details about process 316 of FIG. 3. The key difference between the method depicted in FIG. 7 and that depicted in FIG. 6 is that the method illustrated in FIG. 7 may optionally comprise the process 716 of distributing the degree for some cells. In graph theory, the degree or valency of a vertex of a graph denotes the number of edges incident to the vertex with loops counted twice.

As it may be seen in FIGS. 12-13, the Voronoi cells generated may comprise multiple polygons each having three or more sides. Therefore, the vertices in a graph constructed in, for example, process 320 may not have a uniform degree. In some embodiments, the method may construct the graph by accounting for all edges each connecting two nodes of a pair of neighboring cells. In some embodiments, the method may optionally configuring the conductivity among the cells by, for example, substantially equally distributing the conductivity of a node in the angular direction.

For example, the method may determine a uniform degree of, for example, four for all nodes and reconfiguring cells that exhibit degrees higher than four. In the example illustrated in FIG. 12P, node 1202P exhibits a degree of five if all conductivity is to be considered. The method may reconfigure the conductivity for the cell corresponding to node 1202P to have the uniform degree of four by substantially uniformly distributing the degree in the angular direction around node 1202P. As a result of reconfiguring the conductivity, node 1202P is exhibiting a degree of four where the conductivity between node 1202P and node 1204P is not present. It shall be noted that it is optional to reconfiguring the conductivity, and thus FIG. 12P still shows that some nodes (e.g., node 1206P showing a degree of five) are still exhibiting some non-uniform degree(s). The remaining of process 702, 704, 706, 708, 710, 712, 714, 718, 720, and 722 may be performed in substantially similar manners as those described for 602, 604, 606, 608, 610, 612, 614, 616, 618, and 620 of FIG. 6.

Figure 8:
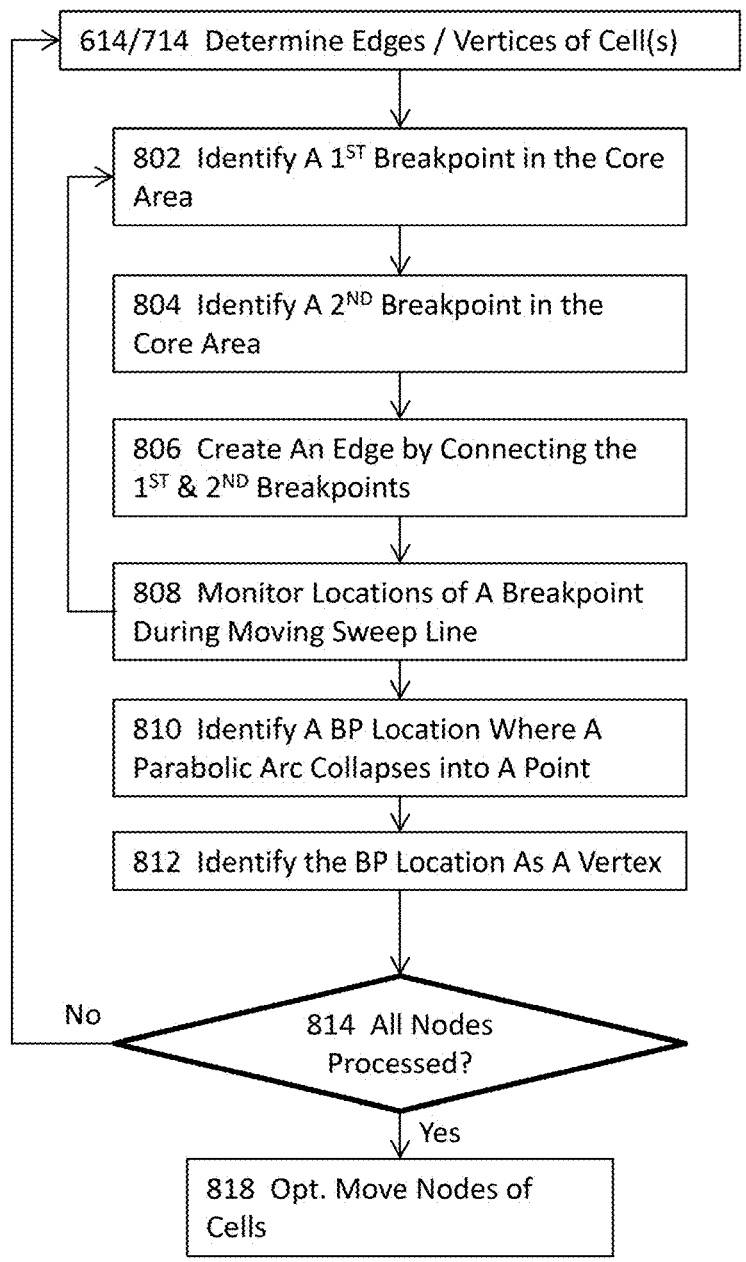
FIG. 8 illustrates more details about the top level flow diagrams for implementing physical design decomposition with custom connectivity illustrated in FIGS. 6-7 in some embodiments.

FIG. 8 illustrates more details about the top level flow diagrams for implementing physical design decomposition with custom connectivity illustrated in FIGS. 6-7 in some embodiments. More specifically, FIG. 8 illustrates more details about process 614 of FIG. 6 or 714 of FIG. 7. In some embodiments, the process 614 or 714 may comprise the process 802 of identifying a first breakpoint created by the intersection of two parabolas in the core area. In some embodiments, the process 614 or 714 may comprise the process 804 of identifying the second breakpoint created by the same two parabolas that create the first breakpoint at 802 in the core area.

In some embodiments, the process 614 or 714 may comprise the process 806 of creating an edge by connecting the first and the second breakpoints. In some embodiments, the process 614 or 714 may comprise the process 808 of monitoring or tracking the location of the first breakpoint or the second breakpoint when process 606 or 706 moves the sweep line across the core area. It shall be noted that because a parabola comprises a collection of points that are equidistant from the sweep line and a node, the breakpoints and thus the edge moves as the sweep line moves across the core area because the distance between the node and the sweep line continues to change.

In some embodiments, the process 614 or 714 may comprise the process 810 of identifying a breakpoint location where a parabolic arc collapses, shrinks, or degenerates (collectively shrinks) into a one-dimensional point. In some embodiments, the process 614 or 714 may comprise the process 812 of identifying the breakpoint location identified at 810 as a vertex. In some embodiments, the process 614 or 714 may comprise the process 814 of determining whether or not all the nodes have been considered.

In some embodiments, all nodes are considered processed if the sweep line sweeps across the entire area of interest (e.g., the core area). Once the sweep line sweeps across the entire area of interest, the parabolas will no longer change, and thus the breakpoints, the edges, and the vertices thus formed will also remain in fixed locations in the area of interest. Therefore, the area of interest will thus be decomposed into a plurality of Voronoi cells. In some embodiments, the process 614 or 714 may optionally comprise the process 816 of moving a node of a Voronoi cell to another geometric reference location, such as but not limited to the centroid of the Voronoi cell.

Figure 9:
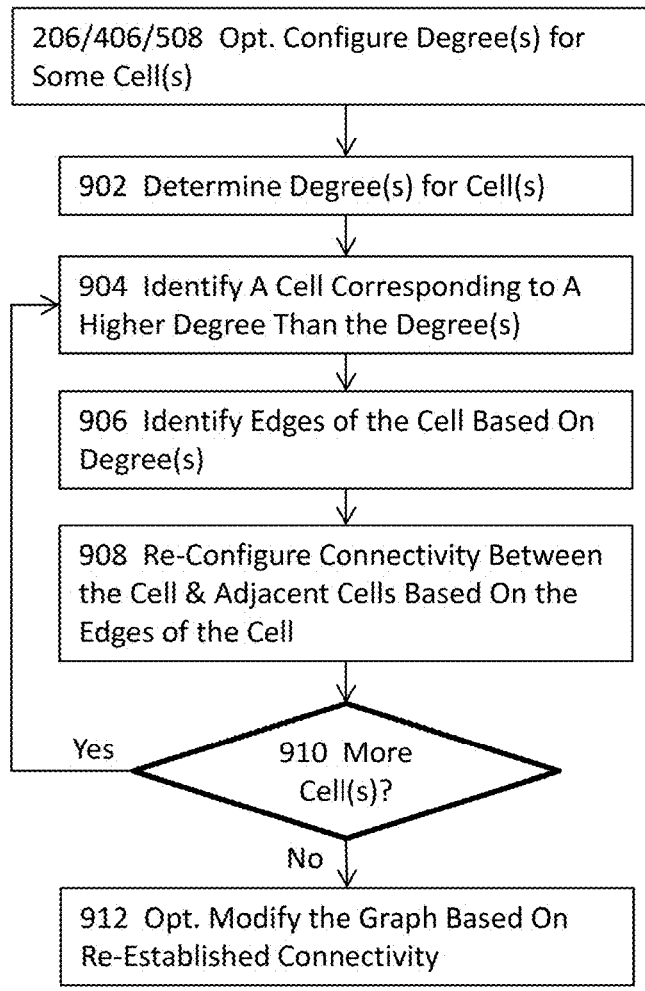
FIG. 9 illustrates more details about the top level flow diagrams for implementing physical design decomposition with custom connectivity illustrated in FIGS. 2 and 4-5 in some embodiments.

FIG. 9 illustrates more details about the top level flow diagrams for implementing physical design decomposition with custom connectivity illustrated in FIGS. 2 and 4-5 in some embodiments. More specifically, FIG. 9 illustrates more details about the process 206 of FIG. 2, 406 of FIG. 4, or 508 of FIG. 5. In some embodiments, the process 206, 406, or 508 may comprise the process 902 of determining one or more degrees to be imposed on one or more vertices in a graph constructed by, for example, process 320 of FIG. 3.

In some embodiments where the method (e.g., process 320 of FIG. 3) constructs a graph based on the plurality of cells into which a physical design space of a design is partitioned into, the number of neighboring cells of a cell is the degree of the vertex, which represents the cell in the decomposition, in the graph. Therefore, the instant application uses the term "degree" to represent the number of edges incident to a vertex with loops counted twice in a graph or as the number of neighboring cells in a decomposed physical design. In some embodiments, the process 206, 406, or 508 may comprise the process 904 of identifying a cell that corresponds to a higher degree than the one or more degrees determined at 902.

For example, the process 206, 406, or 508 may, at 902, determine a degree of four that is to be applied to some cells and then identify a cell that corresponds to a degree of five at 904. In some embodiments, the process 206, 406, or 508 may comprise the process 906 of identifying a first number of edges from all of the edges of the cell identified at 904, where the first number is equal to a determined degree to be applied in the one or more degrees determined at 902. In the above example where the identified cell corresponds to a degree of five whereas a degree of four is to be applied to the identified cell, the process 906 may identify four edges from the total of five edges of the identified cell.

In some embodiments, the process 906 identifies the first number of edges by selecting the longest first number of edges. In some embodiments, the process 906 identifies the first number of edges by attempting to substantially equally distributing the edges around the node of the identified cell in the angular direction. The nodes corresponding to the identified edges (each edge is shared by two cells, each having a node) will be used to construct the graph by, for example, process 320 of FIG. 3 and to reconfigure conductivity for the cell identified at 904. It shall be noted that the term "substantially" is used here because a cell, such as a Voronoi cell, is of a polygonal shape having edges of varying lengths. Therefore, the process 906 may not necessarily be able to precisely, equally distribute or reconfigure the conductivity in the angular direction. In some other embodiments, the method may achieve a substantial uniform degree for the nodes by weighting each edge connecting two nodes with a respective weight. In some embodiments, the respective weight for an edge with respect to a node in a cell may be determined to be inversely proportional to the degree or the degree to the n-th power (where n is a positive real number) of the node or the number of neighboring cells of the cell or the number of the neighboring cells to the n-th power (wherein n is a positive real number.) In some embodiments, the power n may be determined based at least on one or more force models that are used to distribute the nodes or to drive the cells to convergence. For example, if a first Voronoi cell having a first node and four neighboring cells is adjacent to a second Voronoi cell having a second node and five neighboring cells, each first edge connected to the first node for the first cell may be weighted by a first factor of $C_1*(1/4)^n$, where C1 is a constant (e.g., arbitrary constant) and n is a positive real-number. In this example, each second edge connected to the second node for the second cell may be weighted by a second factor of $C_2*(1/5)^n$, where C2 is a constant (e.g., an arbitrary constant) and n is a positive real-number. In addition, a process to configure or reconfigure conductivity is optional and thus may not necessarily be performed to all cells exhibiting degrees higher than the determined one or more degrees to be applied in some embodiments or may not even be performed at all in some other embodiments.

In some embodiments, the process 206, 406, or 508 may comprise the process 908 of configuring or reconfiguring the conductivity of the cell identified at 904 and one or more other cells based at least in part on the identified or non-identified edge(s) of the cell identified at 904. In some embodiments, the process 206, 406, or 508 may comprise the process 910 of determining whether there is another cell to be processed. In some embodiments where the process 910 determines that there is another cell to be processed, the process 206, 406, or 508 returns to 904 to identify the cell and repeats the processes 904~910 until all cells to be processed have been processed. It shall be noted that the processes 206, 406, and 508 are optionally, and thus the processes 206, 406, and 508 may nonetheless proceed to 912 even when the process 910 determines that there are more cells to be processed. In some embodiments, the process 206, 406, or 508 may optionally comprise the process 912 of modifying the graph (e.g., the graph generated by process 320 of FIG. 3) based at least in part on the conductivity that has been configured or reconfigured at 908.

Figure 10:
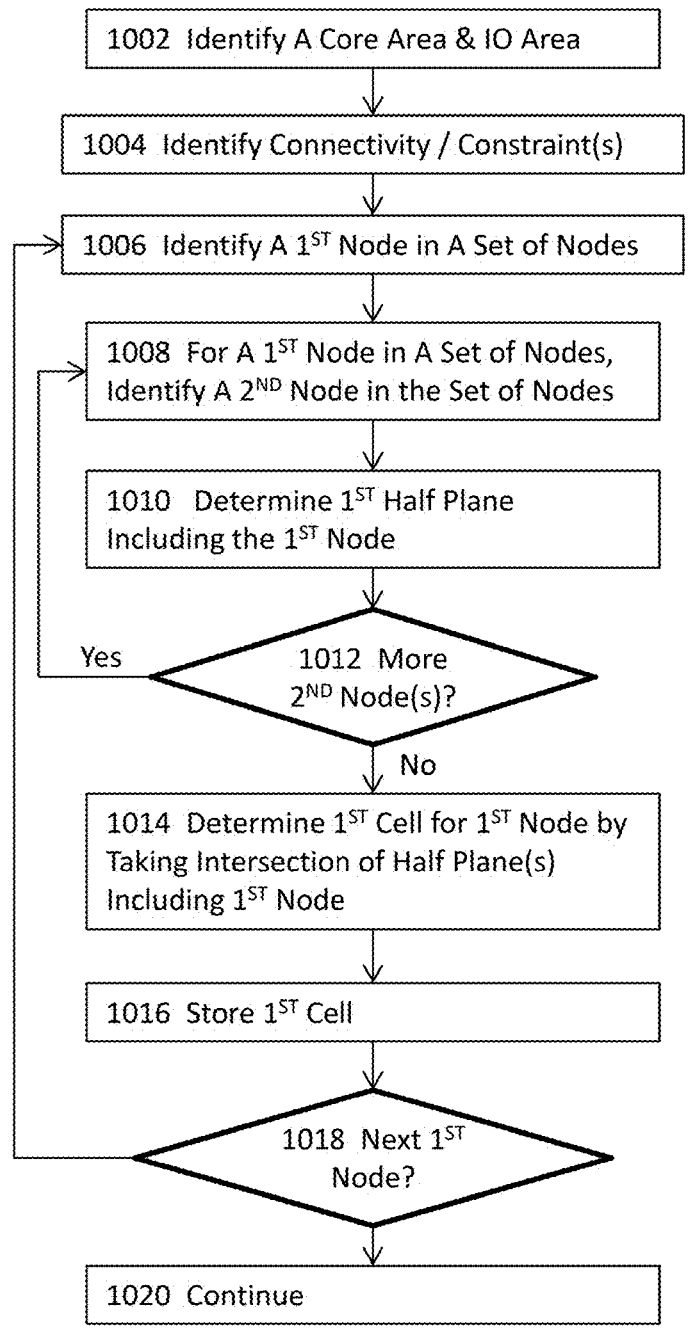
FIG. 10 illustrates more details about the top level flow diagrams for implementing physical design decomposition with custom connectivity in some embodiments.

FIG. 10 illustrates a top level flow diagram for implementing physical design decomposition with custom connectivity in some embodiments. More specifically, FIG. 10 illustrates another approach for performing Voronoi decomposition for a physical design space to create a floorplan or a placement layout in some embodiments. In one or more embodiments, the method illustrated in FIG. 10 may comprise the process 1002 of identifying a core area and an IO area of a physical electronic design.

In some embodiments, the method may further comprise the process 1004 of identifying conductivity information or one or more constraints specifying how certain portions of the physical electronic design are to communicate or connect to other portion(s) of the physical electronic design. In some embodiments, the method may further comprise the process 1006 of identifying a first node in a set of nodes. In some embodiments, the method may further comprise the process 1008 of identifying a second node in the set of nodes for the first node identified at 1006.

In some embodiments, the method may further comprise the process 1010 of determining a first half plane including the first node. In some embodiments where some nodes may be weighted more than some other nodes, the process 1010 may, instead of determining half planes, construct the plane by offsetting the distance to each node based on the weights of the nodes under consideration. In some embodiments where weighted nodes are to be used to determine Voronoi decomposition of a physical design space, the process 1010 may be deemed a weighted Voronoi decomposition.

In some embodiments, the method may further comprise the process 1012 of determining whether there are more second nodes to be processed. In some embodiments where process 1012 determines that there are more nodes to be processed, the method returns to 1008 to identify another second node and repeats the processes 1008~1012 until all the second nodes are processed for the first node. In some other embodiments where process 1012 determines that all second nodes have been processed for the first node, the method may proceed to 1014.

In some embodiments, the method may further comprise the process 1014 of determining a first cell for the first node by taking intersection of all the half planes including the first node and created by process 1010. In some embodiments, the method may further comprise the process 1016 of storing the first cell. In some embodiments, the method may further comprise the process 1018 of determining whether there are more first nodes to be processed. In some embodiments where process 1018 determines that there are more first nodes to be processed, the method returns to 1006 and repeats 1006~1018 until all the first nodes are processed. In some other embodiments where process 1018 determines that all the first nodes have been processed, the method may proceed to 1020 to continue to other process(es).

Figure 11A:
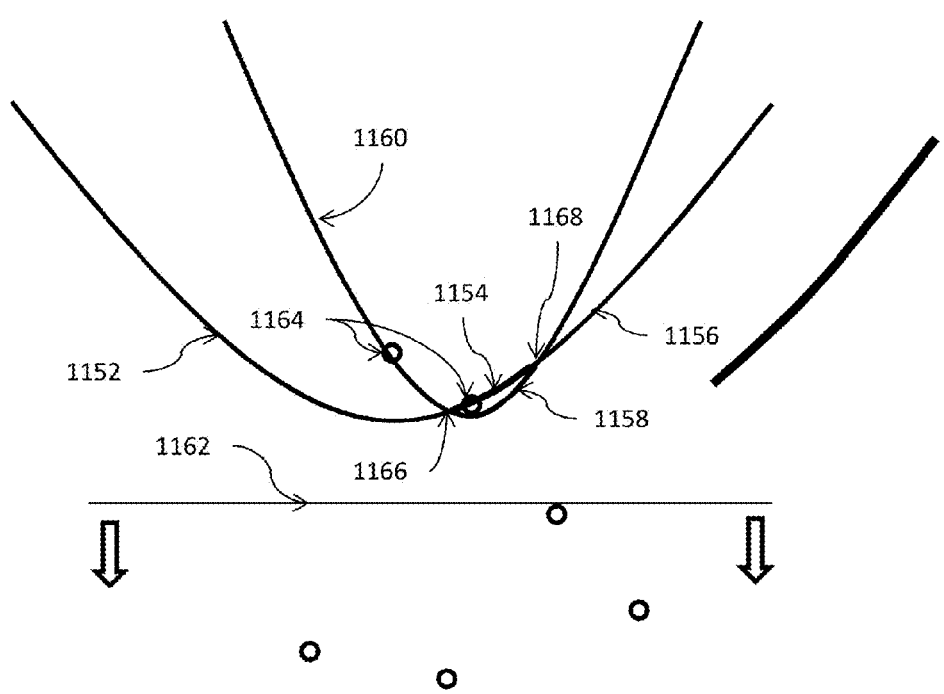
FIGS. 11A-B illustrate more details about the physical design decomposition in some embodiments.
Figure 11B:
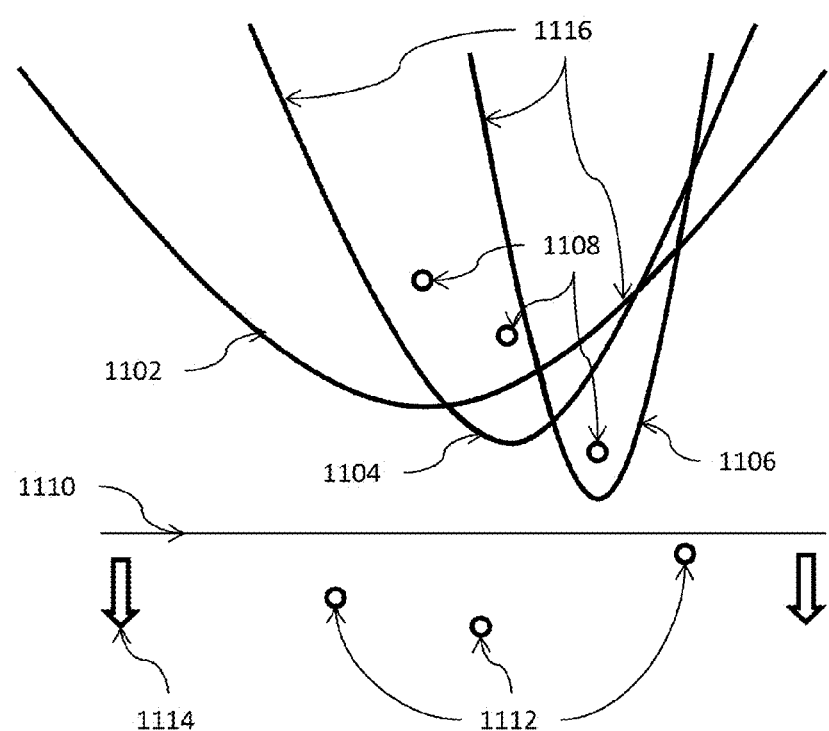

FIGS. 11A-B illustrate more details about the physical design decomposition in some embodiments. More specifically, the circular shapes denote nodes; 1162 represents a sweep line that move in the vertical direction as shown by the arrow heads; and nodes 1164 (two) are covered in the area (the area above the sweep line 1162) and thus two parabolas 1152 and 1156 have been created. Moreover, the collection of parabolic arcs, 1152, 1156, and 1156 in the darker color, represent the beach line. The intersections of the two parabolas, 1166 and 1168, represent two breakpoints. The edge 1154 is determined to connect the two breakpoints 1166 and 1168. The parabolic arcs 1160 in a lighter color is not the lowest parabolic arcs and thus are not included in the beach line.

FIG. 11B illustrates that the sweep line 1110 is moved further down in the vertical direction 1114 such that the swept area now encompasses three nodes 1108, and thus three parabolas are shown. The beach line is shown in a darker color and includes the lowest parabolic arcs 1102, 1104, and 1106. The parabolic arcs 1116 in a lighter color are not the lowest parabolic arcs and are thus not included in the beach line. The three additional nodes 1112 are located in the area that has not been swept by the sweep line and thus are not considered yet in performing the Voronoi decomposition for the area of interest.

Figure 12A:
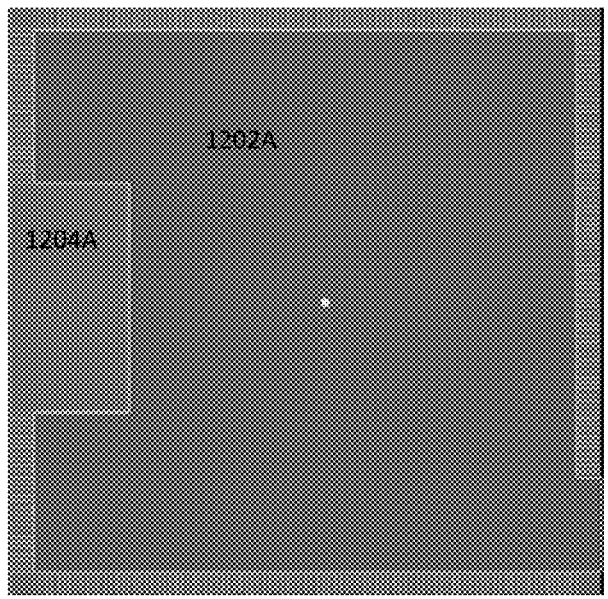
FIGS. 12A-P illustrate how the exemplary physical design decomposition evolves using the some of the processes described herein in some embodiments.
Figure 12B:
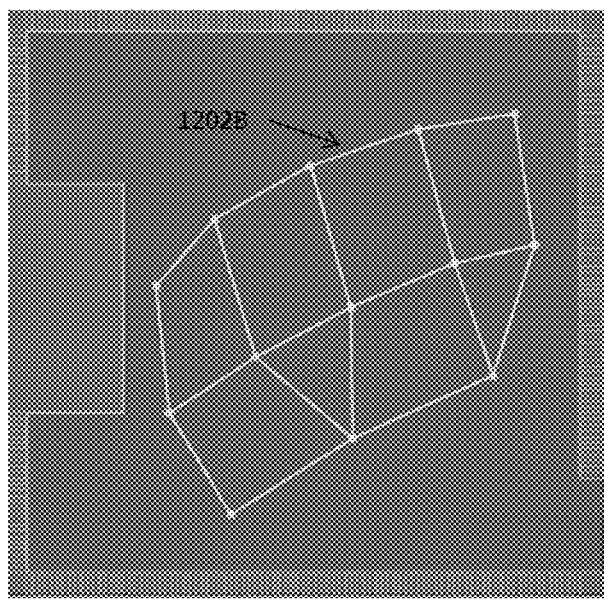
Figure 12C:
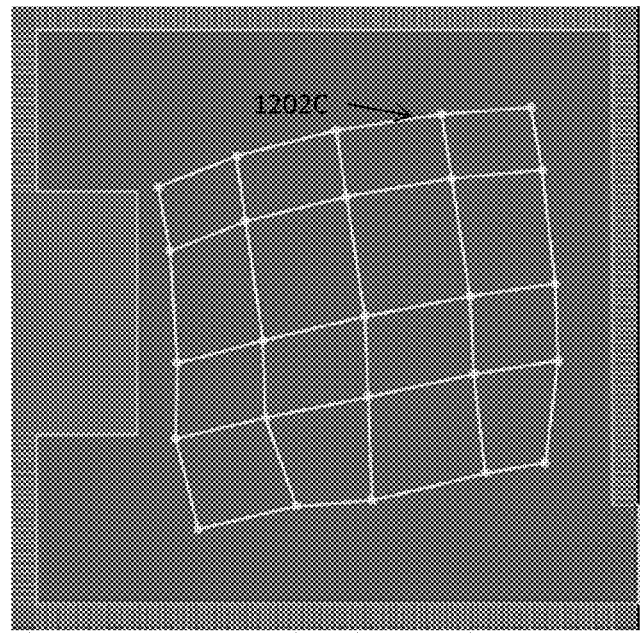
Figure 12D:
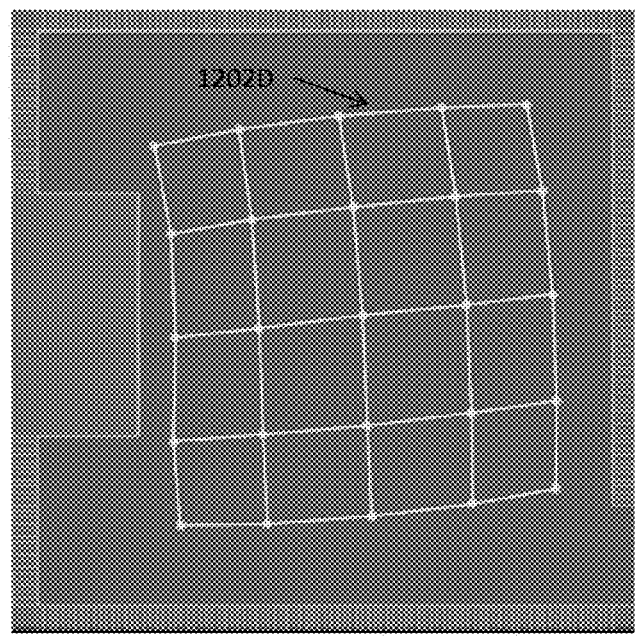
Figure 12E:
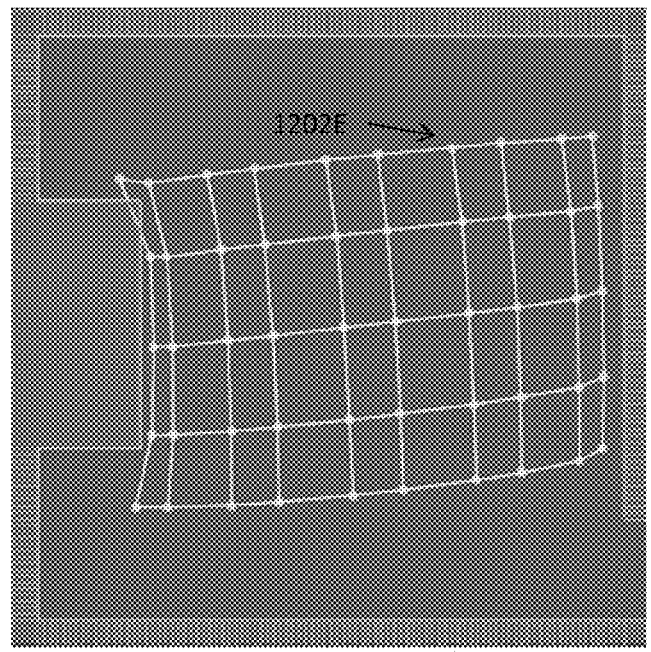
Figure 12F:
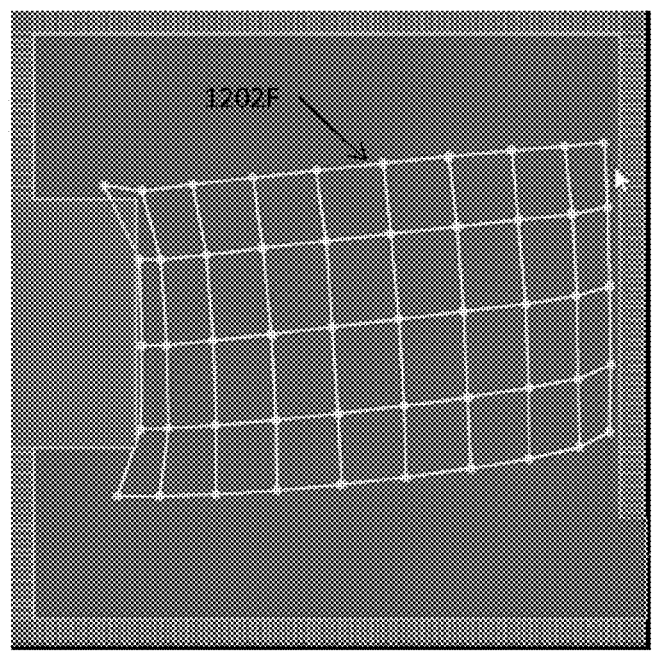
Figure 12G:
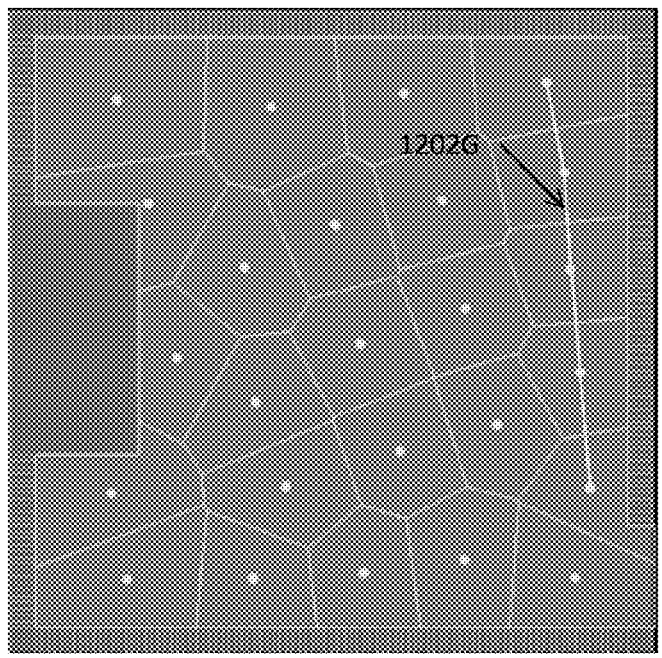
Figure 12H:
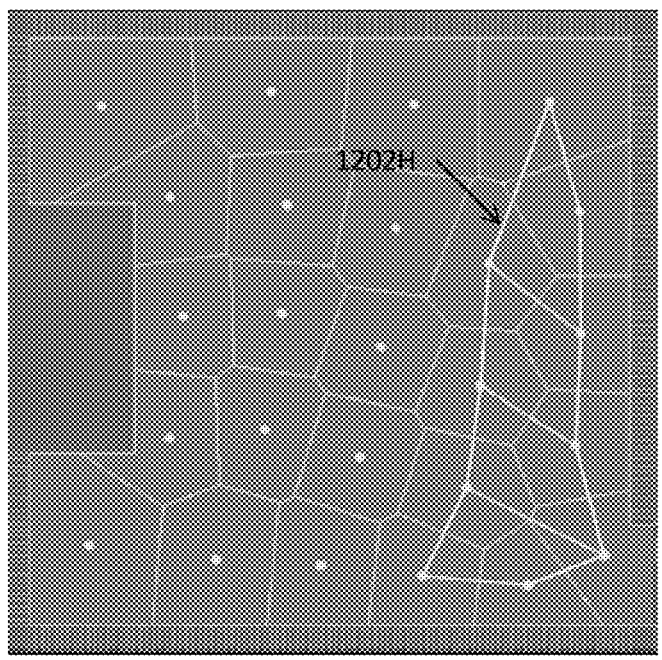
Figure 12I:
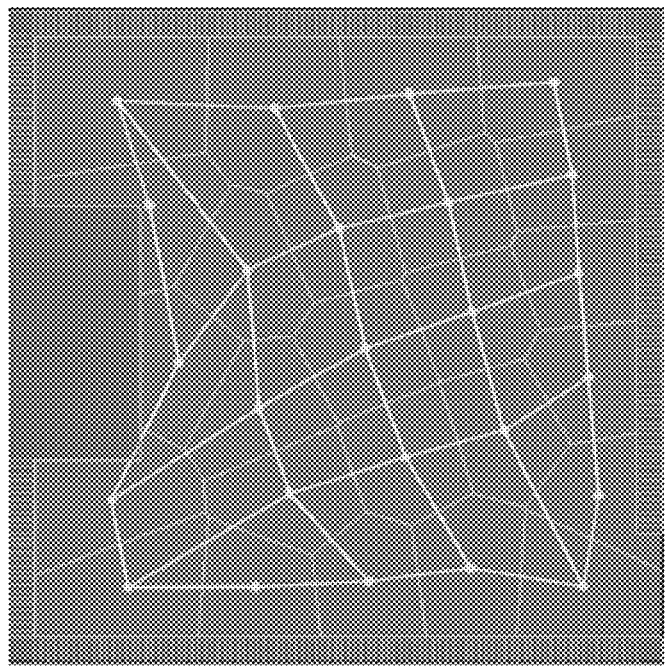
Figure 12J:
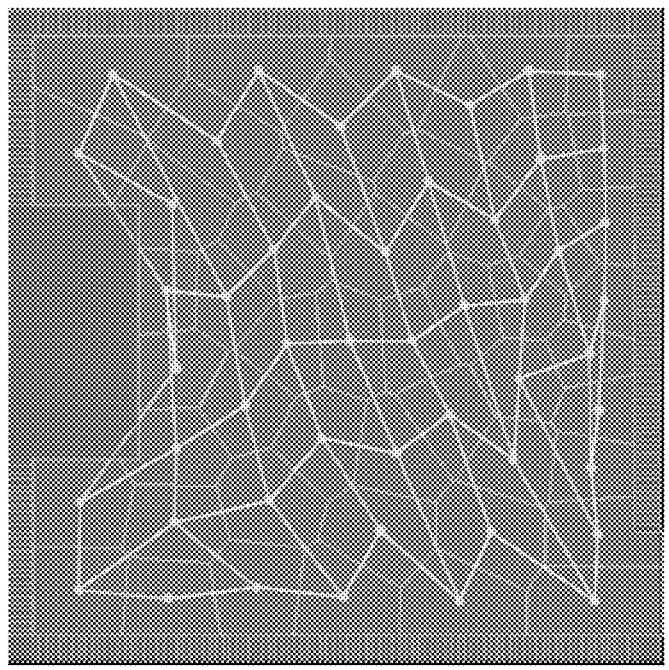
Figure 12K:
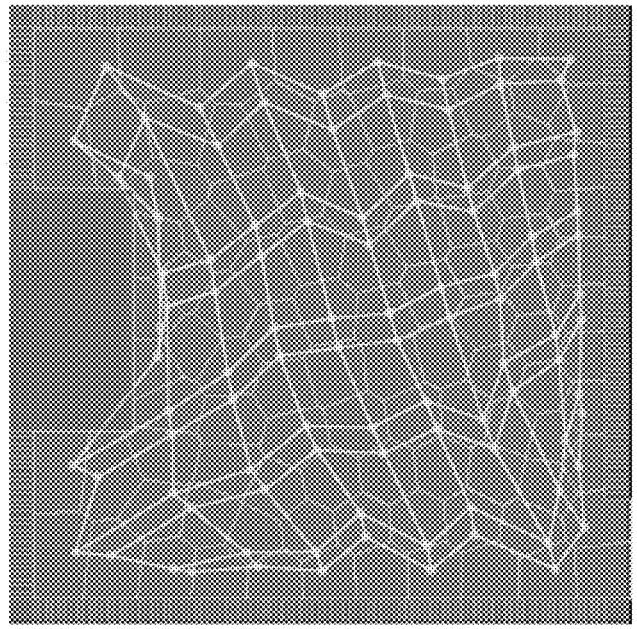
Figure 12L:
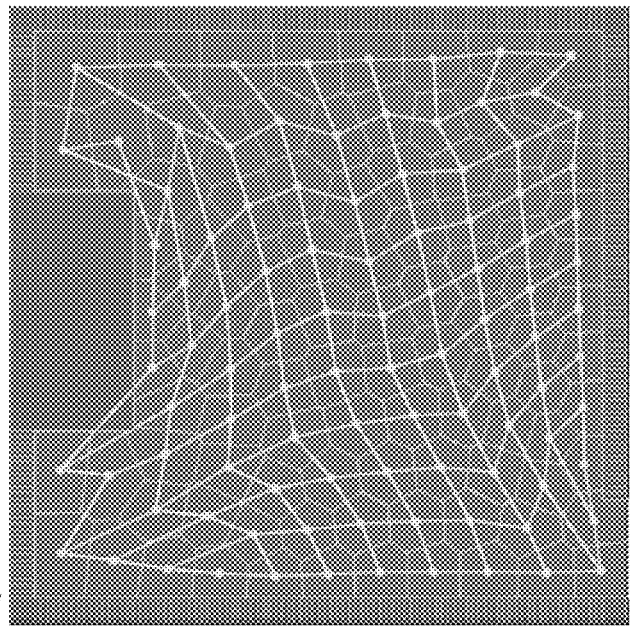
Figure 12M:
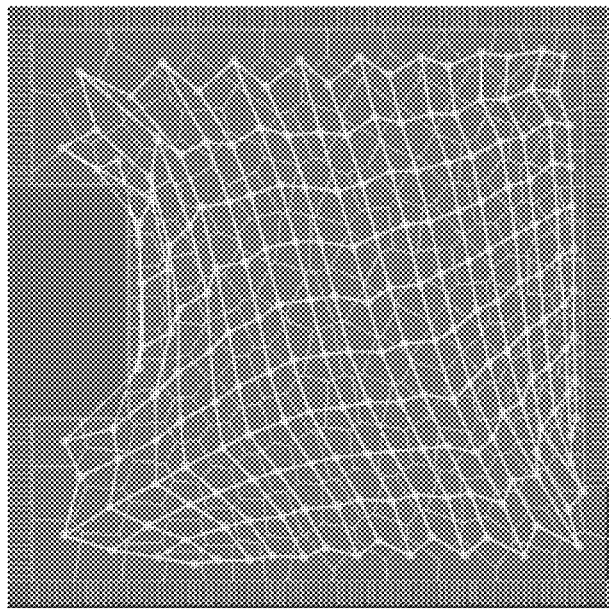
Figure 12N:
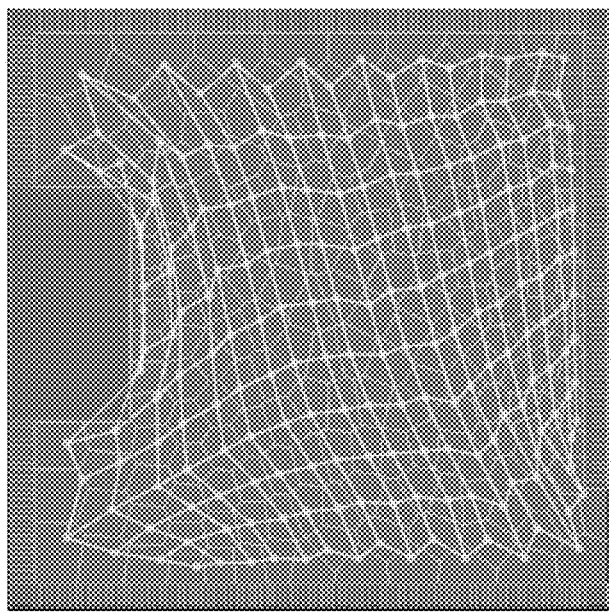
Figure 12O:
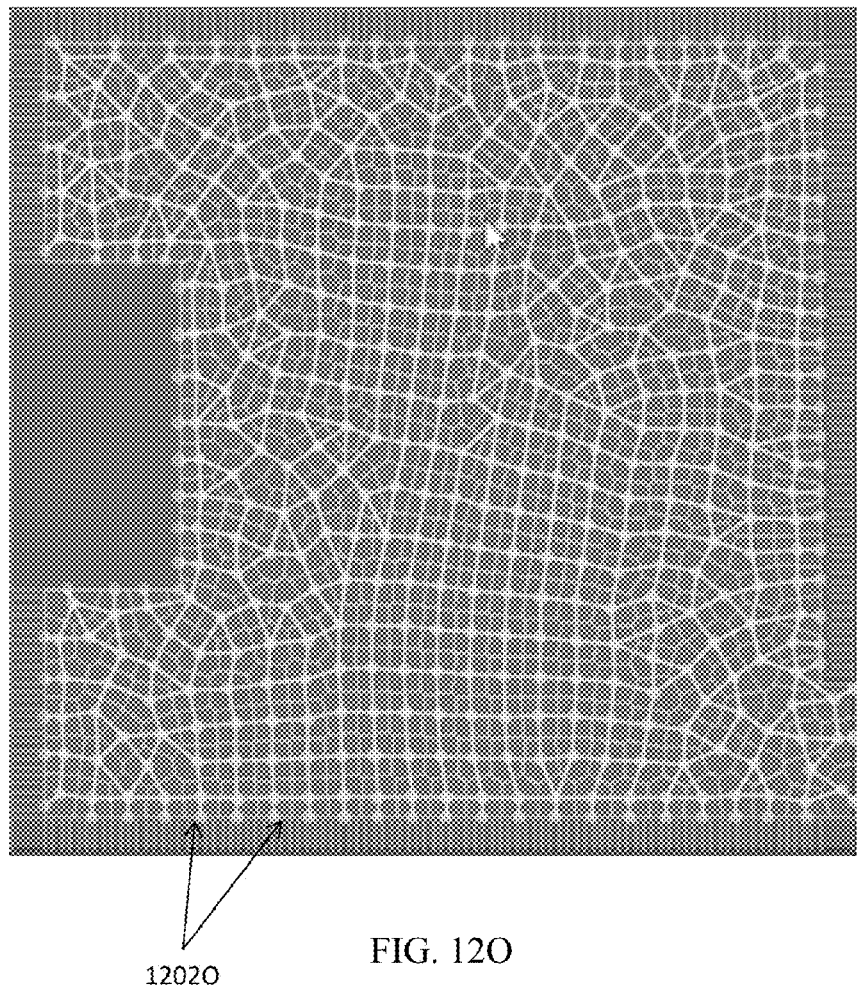
Figure 12P:
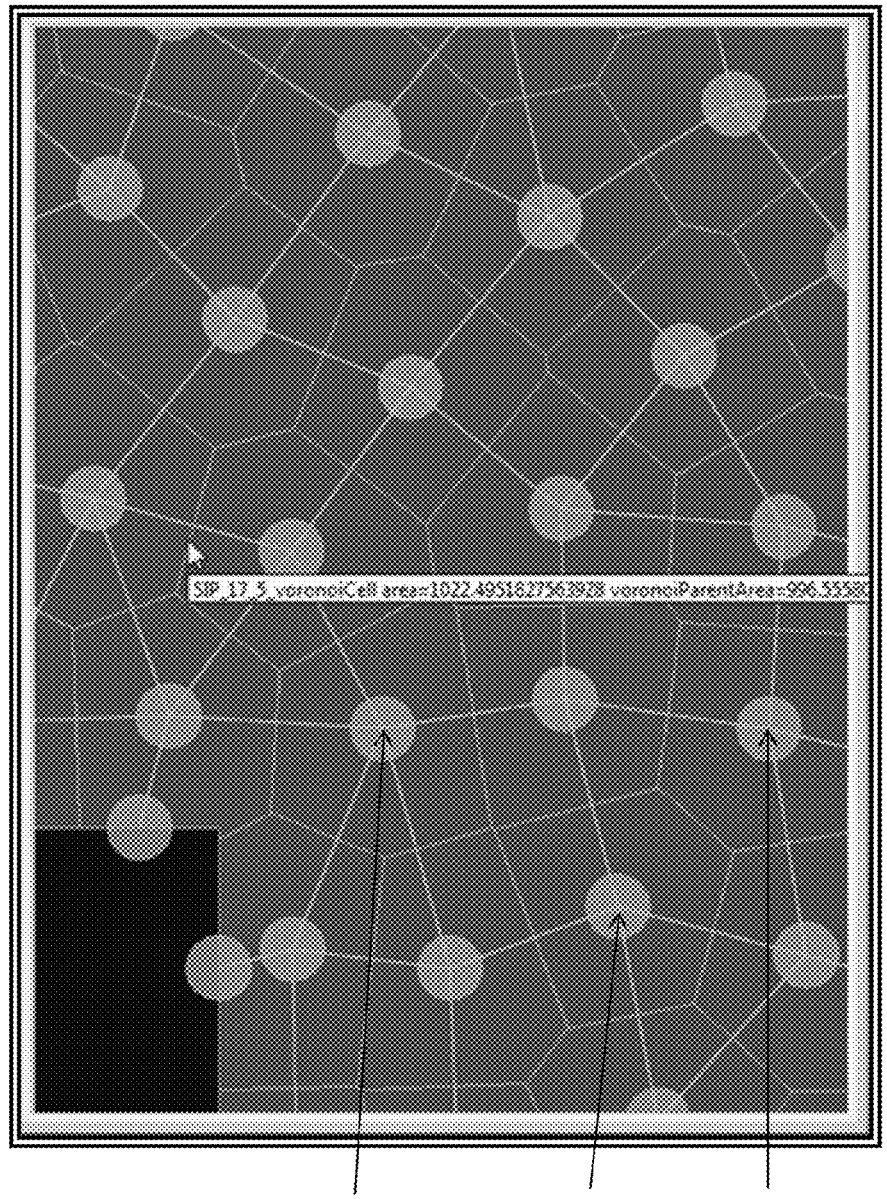

FIGS. 12A-P illustrate how the exemplary physical design decomposition evolves using the some of the processes described herein in some embodiments. More specifically, FIGS. 12A-B illustrates the initial physical design space including the core area 1202A and the IO area 1204A that substantially surrounds the core area 1202A. 1202B represents the decomposition of the core area into a 4×2 grid. FIGS. 12C-D illustrate how the initial 4×2 grid gradually evolves into a 4×4 grid (1202C in FIGS. 12C and 1202D in FIG. 12D) at a lower hierarchical level by pushing down from the higher hierarchical level of FIGS. 12A-B to the lower hierarchical level of FIGS. 12C-D.

FIGS. 12E-F shows the continuous evolution of the decomposition of the core area by pushing down to another lower hierarchical level having the 10×5 grid (1202E and 1202F). FIGS. 12G-H illustrate the evolving Voronoi decomposition of the core area where the Voronoi cells are driven to a target area, and the edges 1202G and 1202H respectively represent the conductivity (e.g., user specified conductivity) and the reconfigured conductivity in which the nodes exhibit degrees of 2 or 3 in 1202H.

FIGS. 12I-J illustrate the intermediate versions of the layout with the nodes of the Voronoi cells and how the Voronoi cells continue to change by moving the nodes (e.g., by using a force directed placement model). These two figures further illustrate that the initial, user-specified conductivity collapsed during the initial Voronoi decomposition into multiple hierarchical levels. In these embodiments, the term "collapse" indicates the process of iteratively reducing a graph having multiple nodes and some connectivity into multiple hierarchical levels by at least merging or collapsing edges that connect nodes that may be grouped at the next higher hierarchical level in some embodiments. In some of these embodiments, the nodes on both ends of an edge are merged into a single parent node when the edge collapses. In some other embodiments, nodes that share some characteristics that indicate it may be needed or desirable to physically group these nodes but do not necessarily connected by an edge may also be merged into a single parent node at a higher hierarchical level. In some embodiments, these characteristics may include, for example but not limited to, the presence of certain nodes in the same module of a logical design hierarchy, or the connection to the same clock domain, etc. FIGS. 12K-N illustrates further pushing down to even lower hierarchical levels, moving the nodes of the Voronoi cells, re-performing the Voronoi decomposition based on the moved nodes, and inferring or reconfiguring the conductivity among the Voronoi cells.

FIG. 12O illustrates the final Voronoi decomposition of the core area. FIG. 12O further illustrates anchoring (12020) some Voronoi cells at the edges of the core area to some IO cells in the IO area. In the example illustrated in FIG. 12P, node 1202P exhibits a degree of five if all conductivity is to be considered. The method may reconfigure the conductivity for the cell corresponding to node 1202P to have the uniform degree of four by substantially uniformly distributing the degree in the angular direction around node 1202P. As a result of reconfiguring the conductivity, node 1202P is exhibiting a degree of four where the conductivity between node 1202P and node 1204P is not present. It shall be noted that it is optional to reconfiguring the conductivity, and thus FIG. 12P still shows that some nodes (e.g., node 1206P showing a degree of five) are still exhibiting some non-uniform degree(s).

Figure 13A:
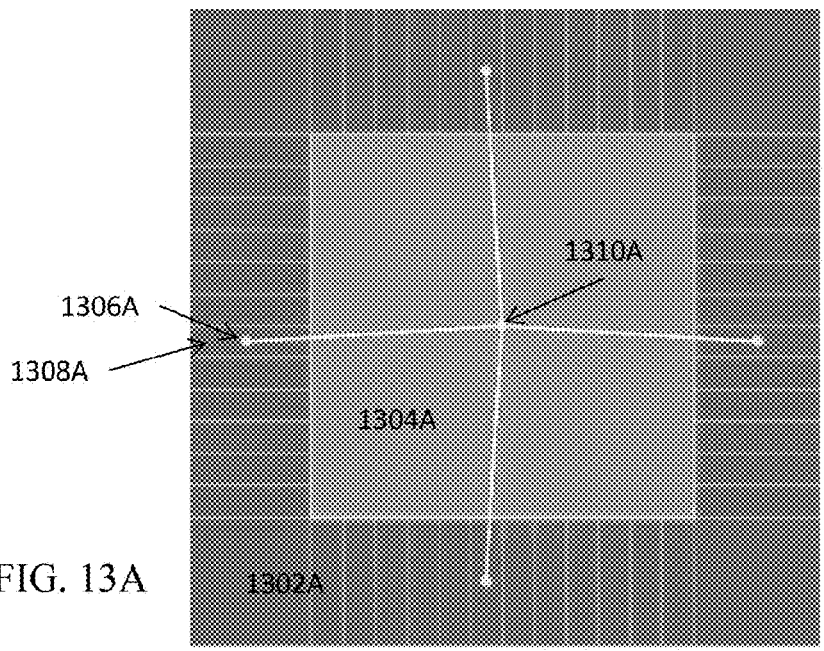
FIGS. 13A-H illustrate how the exemplary physical design decomposition evolves using the some of the processes described herein in some embodiments.
Figure 13B:
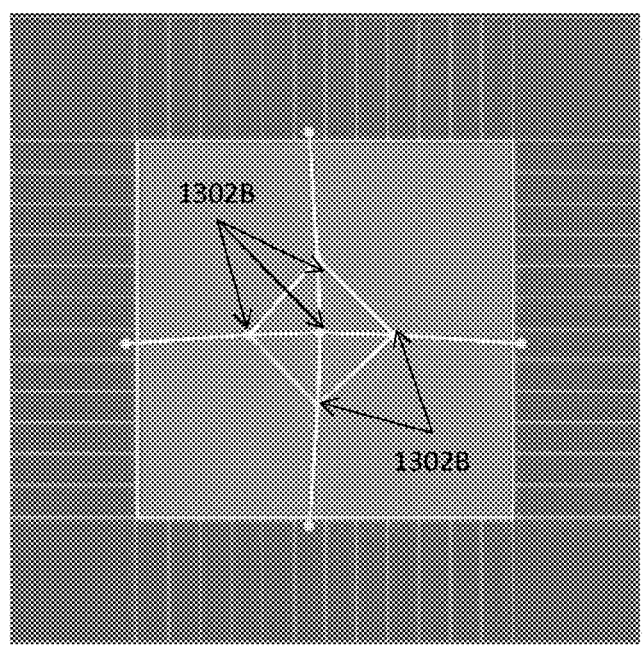
Figure 13C:
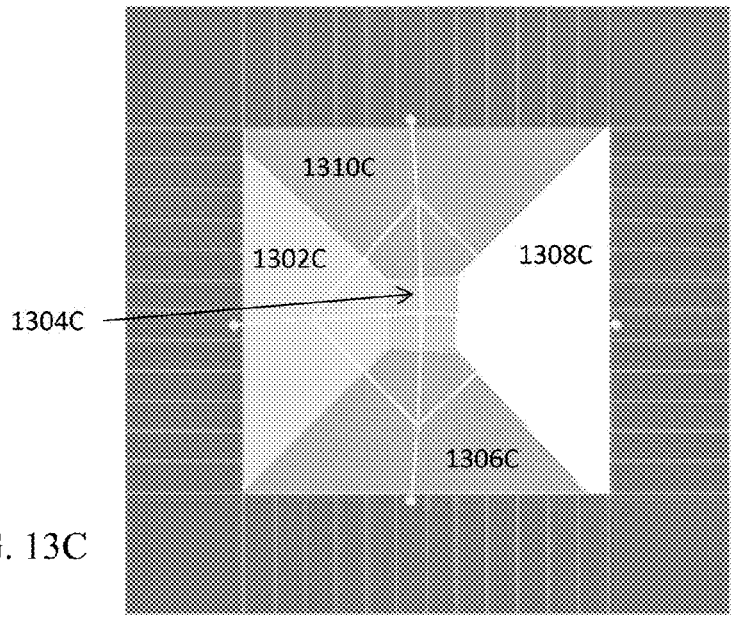
Figure 13D:
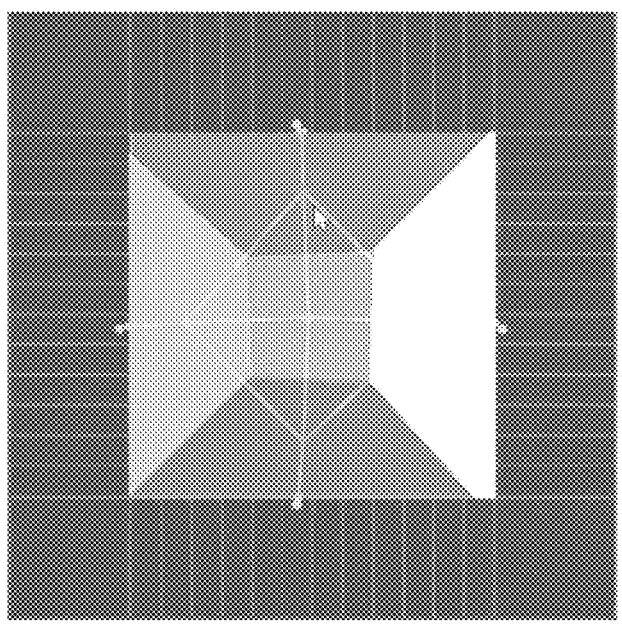
Figure 13E:
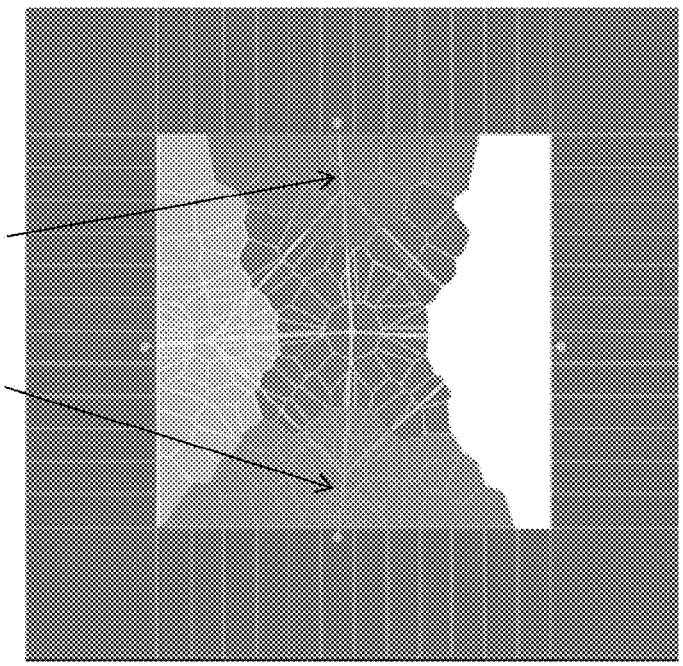
Figure 13F:
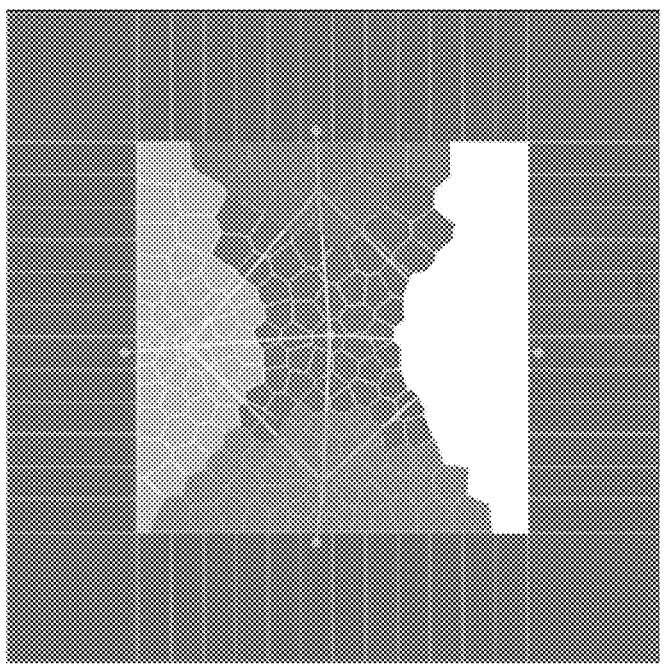
Figure 13G:
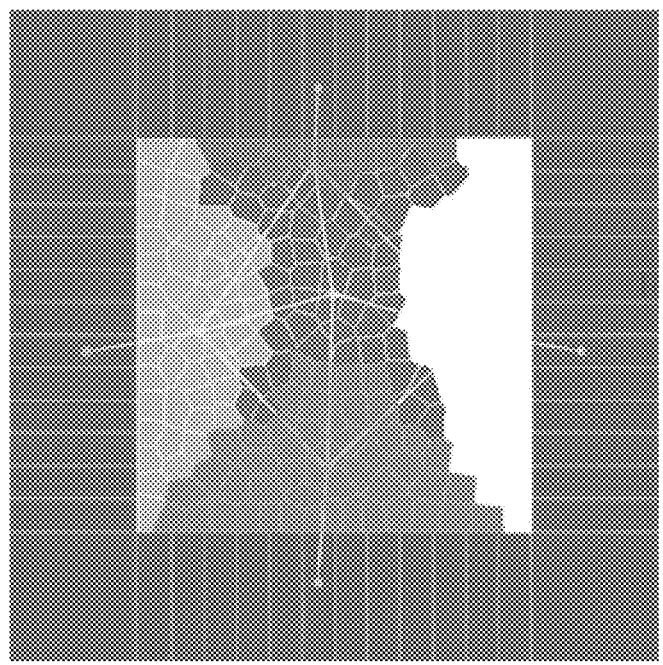
Figure 13H:
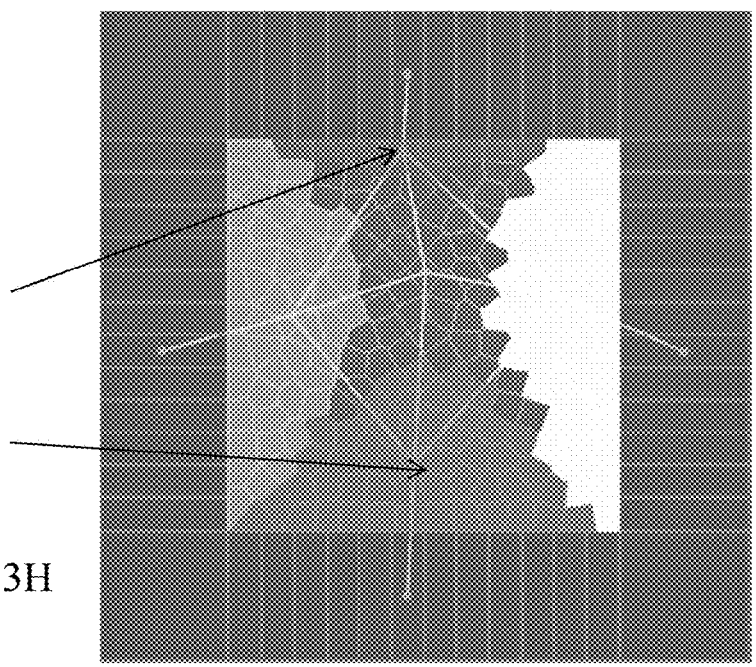

FIGS. 13A-H illustrate how the exemplary physical design decomposition evolves using the some of the processes described herein in some embodiments. More specifically, FIG. 13A illustrates an electronic design including an IO area 1302A with a plurality of IO cells and a core area 1304A. FIG. 13A further illustrates custom conductivity information such as user specified conductivity that requires the node 1310A communicate or connect to node 1306A in IO cell 1308A and three other IO nodes in their respective IO cells.

Moreover, FIGS. 13A-H illustrate that the core area is to be decomposed into five regions, four of which have the size that is five times the size of the remaining region. FIGS. 13B-H illustrate Voronoi decomposition of the core area 1302A into five regions each having a plurality of Voronoi cells. As it may be seen from FIG. 13C, various decomposition processes may decompose the core area into five regions that correspond to the five nodes 1302B in FIG. 13B. Without imposing a convergence criterion such as a target area criterion, the initial decomposition of the core area five regions as shown in 1302C, 1304C, 1306C, 1308C, and 1310C of FIG. 13C and gradually into the corresponding five regions as shown in FIGS. 13D-F.

FIGS. 13E-H illustrate the result of applying the size constraint that requires the area of region 1302H be approximately one-fifth (⅕) of any of the other four regions. As it may be seen from FIG. 13E, some embodiments described herein introduced approximately five times as many nodes in region 1304E than in region 1302E and iteratively performs the Voronoi decomposition with, for example, one or more attractive force models. FIG. 13H illustrates the final Voronoi decomposition of the core area in which region 1302H has approximately one-fifth (⅕) the size of region 1304H.

Moreover, as it can be seen in FIGS. 13B-H, the custom conductivity as shown in FIG. 13A has been maintained throughout the entire decomposition process by using, for example, one or more force models together with the containment force model in which the edges of a containment (e.g., IO cell 1308A) and a node contained therein (e.g., node 1306A) repulse each other. It shall be noted that any physical entity in a physical design may be used as a containment by using a substantially similar model. More details about the force models and the containment force model are described in U.S. patent application Ser. No. 13/842,890 entitled "METHODS, SYSTEMS, AND ARTICLES OF MANUFACTURE FOR IMPLEMENTING PHYSICAL DESIGN USING FORCE MODELS WITH CUSTOM CONNECTIVITY", the content of which is hereby incorporated by reference in its entirety for all purposes. It shall also be noted that the custom conductivity illustrated in FIG. 13A requires the node 1310A in the core area be connected to four IO cells (e.g., 1308A). Nonetheless, custom conductivity may also be applied to nodes within the IO area or nodes within the core area in the same manner in some embodiments.

Figure 14C:
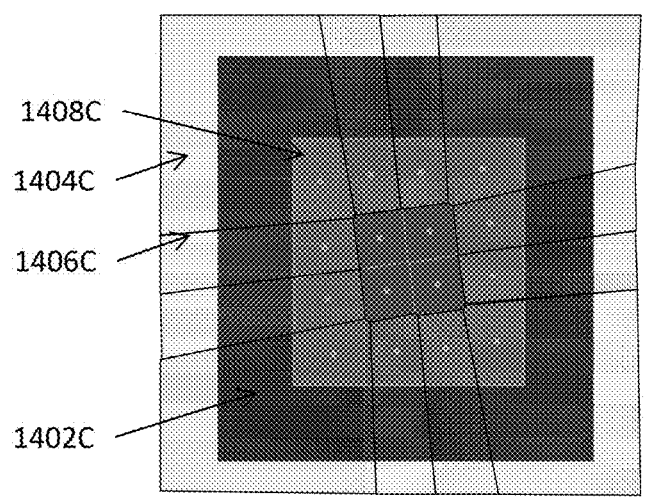

FIGS. 14A-I show an exemplary process and graphical illustrations of anchoring a cell by using one or more containers. More specifically, FIG. 14A illustrates an exemplary flow diagram of a method for anchoring a cell (e.g., a Voronoi cell) in, for example, a core area or a node of the cell (e.g., the Voronoi generation node of the cell) of a set of cells representing the decomposition of an electronic design to, for example, an IO cell or a node of the IO cell in the IO area of the electronic design. In some embodiments, the method illustrated in FIG. 14A may comprise the process 1402A of creating a graph using conductivity information. The graph may be created by using a substantially similar process as process 308 in some embodiments. 1402A is further illustrated in an exemplary implementation shown in FIG. 14B where the edge 1402B represents a part of the conductivity for the 14 nodes (e.g., 1404B) that is used to construct the graph including the edges (e.g., 1402B) and the 16 vertices (e.g., 1404B). In some embodiments, the method may comprise the process 1404A of bounding the set of cells to a container as illustrated in FIG. 14C, where 1404C represents the container that is larger than the entire area of the electronic design or die 1402C. 1406C represents the extension of an edge of the cell boundary of cell 1408C to the boundary of the container 1404C.

In some embodiments, the method may comprise the process 1406A of moving the nodes of the set of cells to their respective points of cells as illustrated in FIG. 14C, where the nodes of the set of cells are moved to the centroids of their respective cells.

Figure 14D:
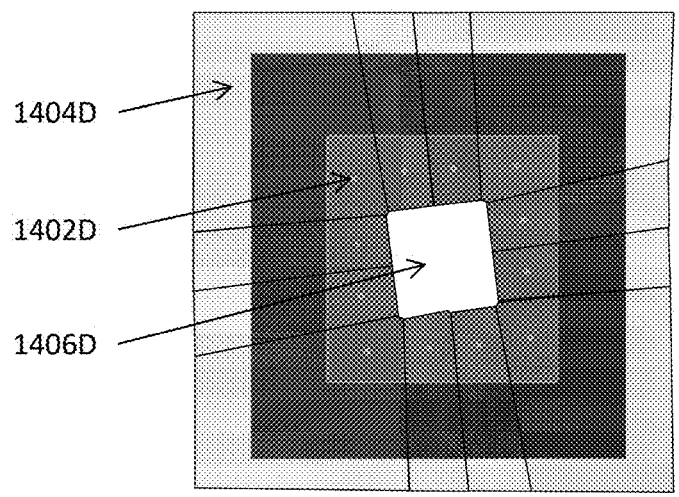

In some embodiments, the method may comprise the process 1408A of identifying a node for which its boundary cell (that corresponds to the cell in the core area with which the node is associated) intersects the off-die area as illustrated in FIG. 14D, where the process may identify, for example, the node corresponding to the boundary cell including 1402D and 1404D that intersects the corresponding portion 1404D of the off-die area. Here, the As process 1408A completes execution, the cells in the region 1406D are no longer used in the method for anchoring certain cells such as the cells at the edge of die in the electronic design.

Figure 14E:
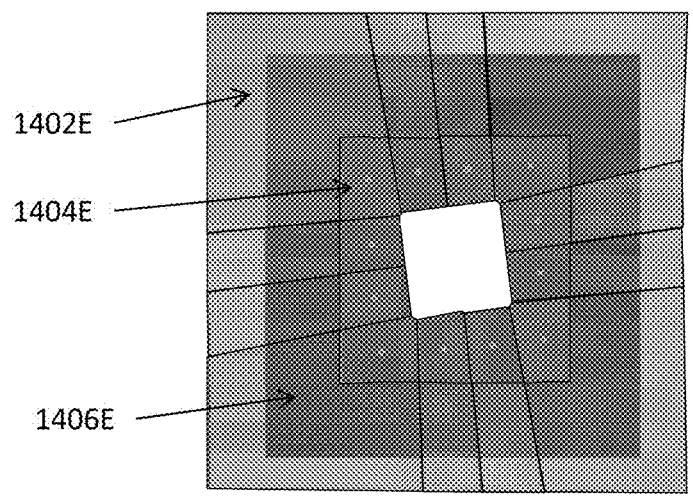

In some embodiments, the method may comprise the process 1410A of splitting the boundary cells into off-die and on-die polygons as illustrated in FIG. 14E, where the polygon 1404E in the core area represents an on-die polygon (although the die may also include the IO area 1406E), and polygon 1402E represents an off-die polygon.

Figure 14F:
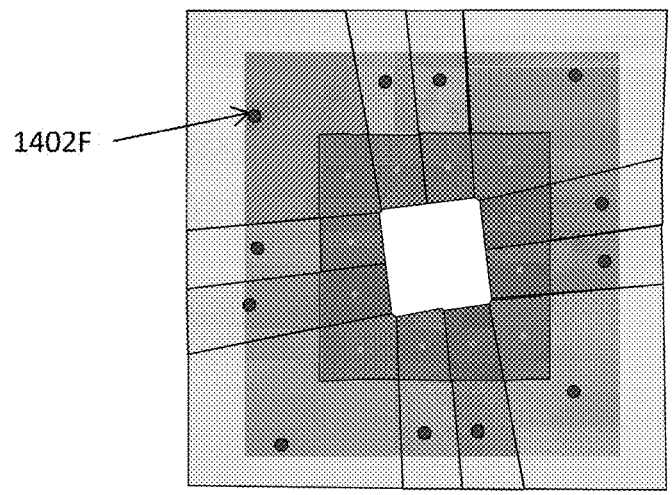

In some embodiments, the method may comprise the process 1412A of determining centroids of the off-die polygons as illustrated in FIG. 14F, where 1402F represents the centroid of the off-die polygon.

Figure 14G:
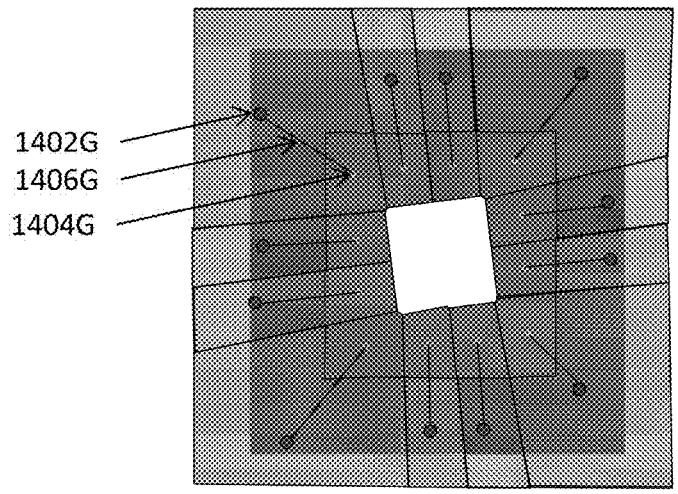

In some embodiments, the method may comprise the process 1414A of connecting a centroid of an off-die polygons to the node of the corresponding cell with a line segment as illustrated in FIG. 14G, where 1402G that represents the centroid of the off-die polygon is connected to node 1404G of the corresponding cell in the core area with a line segment 1406G.

Figure 14H:
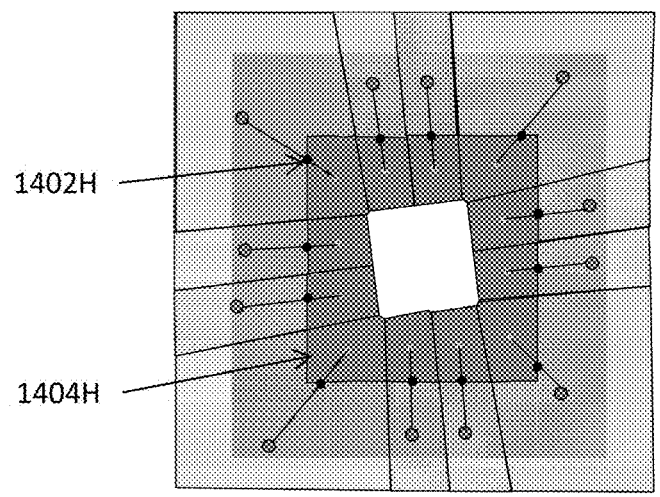

In some embodiments, the method may comprise the process 1416A of determining the intersection of the line segment determined at 1414A with the boundary of the core container polygon as illustrated in FIG. 14H, where 1402H represents the intersection of the line segment determined at 1414A with the boundary of the core container polygon 1404H.

Figure 14I:
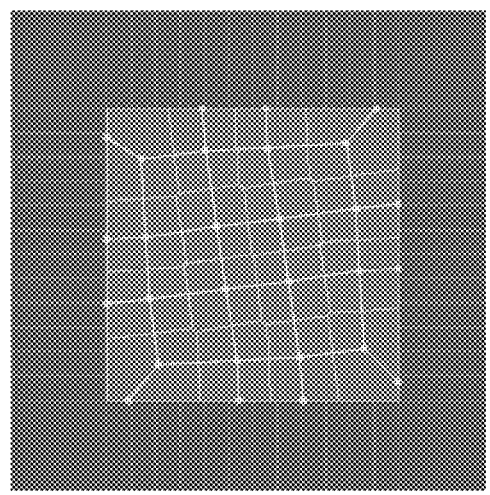

In some embodiments, the method may comprise the process 1418A of derive cell-based connectivity as illustrated in FIG. 14I. In the exemplary embodiment illustrated in FIG. 14I, the conductivity is derived to select the top four neighboring cells to be connected to the cell that is not adjacent to the IO area, and to connect the nodes of the cells that are adjacent to the IO area to the intersection points determined at 1416A.

System Architecture Overview

Figure 15:
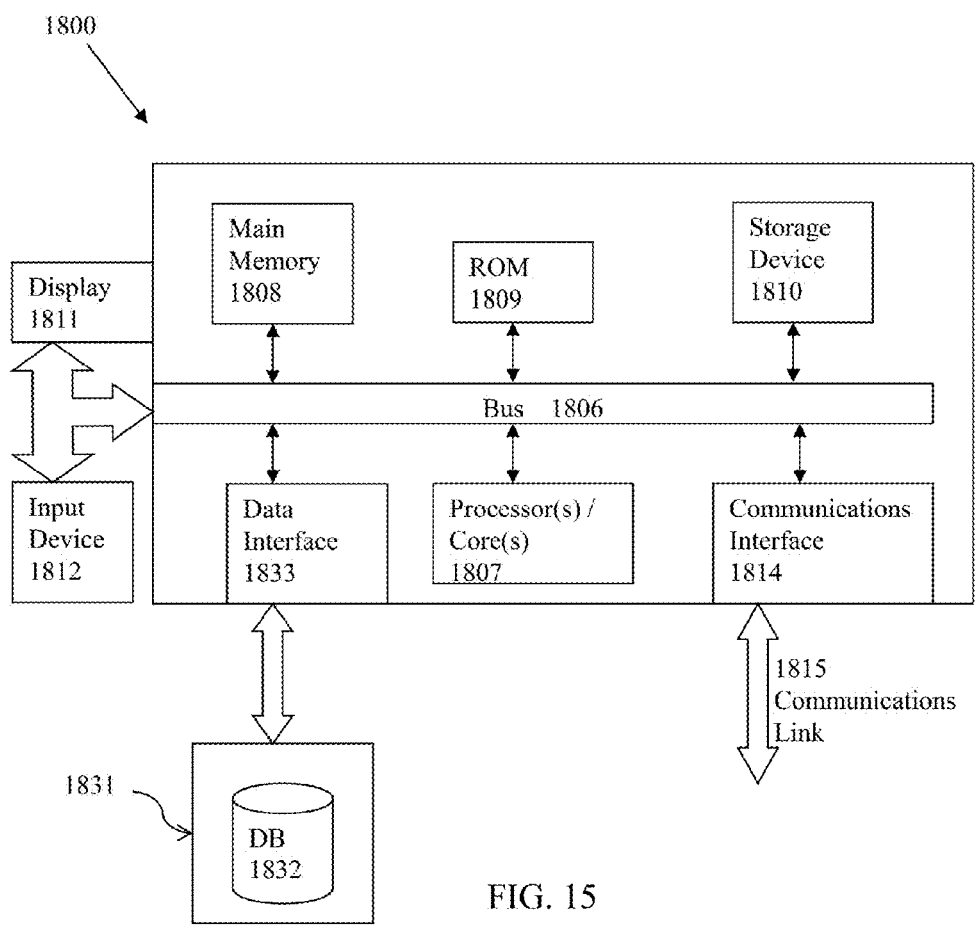
FIG. 15 illustrates a block diagram of an illustrative computing system 1400 suitable for implementing various embodiments described here.

FIG. 15 illustrates a block diagram of an illustrative computing system 1800 suitable for implementing various embodiment of the invention. For example, the exemplary computing system 1800 may be used to implement various processes as described in the preceding paragraphs and the figures such as various processes or modules of determining whether the first post is of interest, various analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive

1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1831, e.g., a data storage system 1831 that contains a database 1832 that is readily accessible by the computer system 1800. The computer system 1800 communicates with the data storage system 1831 through a data interface 1833. A data interface 1833, which is coupled to the bus 1806, transmits and receives electrical, electromagnetic or optical signals that include data streams representing various types of signal information, e.g., instructions, messages and data. In embodiments of the invention, the functions of the data interface 1833 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing physical design decomposition with custom conductivity, comprising:
   at least one processor of a computing system performing a process, the process comprising:
   identifying incomplete conductivity information of an electronic design, wherein
      the incomplete conductivity information includes no information for connecting at least a part of a first cell in the electronic design with another part of the electronic design;
   partitioning a physical design area into multiple cells having a same number of nodes as a total number of cells in the multiple cells; and
   iteratively moving at least some of the same number of nodes to generate a floorplan or a placement layout for the electronic design until the multiple cells satisfy one or more criteria.

2. The computer implemented method of claim 1, in which the process further comprises:
   inferring conductivity information that is more complete than the incomplete conductivity based at least in part upon the multiple cells.

3. The computer implemented method of claim 1, in which the process further comprises:
   reconfiguring the conductivity information by removing connectivity between two nodes of the same number of nodes.

4. The computer implemented method of claim 3, in which the process further comprises:
   repartitioning the physical design area based at least in part upon reconfigured conductivity information.

5. The computer implemented method of claim 3, in which the process further comprises:
   determining a degree for the same number of nodes;
   identifying a cell of the multiple cells that includes a first node and exhibits a first degree higher than the degree;
   identifying a number of edges of the cell, wherein the number is equal to the degree; and removing connectivity between the first node and one or more nodes corresponding to one or more edges of the cell that do not belong to the number of edges identified.

6. The computer implemented method of claim 5, in which the act of identify the number of edges of the cell comprises:
identifying a total number of edges of the cell;
sorting the total number of edges of the cell based at least in part on lengths of the total number of edges; and
selecting a first number of edges from the total number of edges that has been sorted, wherein the first number is equal to the number.

7. The computer implemented method of claim 3, in which the act of reconfiguring the conductivity information is performed to have a substantially uniform distribution of connectivity for a first cell having a first node in an angular direction around the first node.

8. The computer implemented method of claim 1, in which the multiple cells comprise a plurality of Voronoi cells.

9. The computer implemented method of claim 1, wherein no two cells of the multiple cells are overlapping each other.

10. The computer implemented method of claim 1, in which the process further comprises:
anchoring a cell of the multiple cells at an edge of a core area to an input/output cell in an input/output area that substantially surrounds the core area.

11. The computer implemented method of claim 10, in which the act of anchoring the cell is performed using a containment created by the input/output cell.

12. The computer implemented method of claim 11, in which the containment is created by using a force model that cause boundaries of the input/output cell to interact with a input/output node within the input/output cell.

13. The computer implemented method of claim 1, in which the process further comprises:
generating a graph by using the multiple cells as vertices in the graph and at least the conductivity information to create edges between connected vertices.

14. The computer implemented method of claim 1, in which the act of partitioning the physical design area is performed at a higher hierarchical level of the electronic design.

15. The computer implemented method of claim 14, in which the process further comprises:
partitioning the physical design area at a lower hierarchical level into a plurality of cells based at least in part on the multiple cells at the higher hierarchical level of the electronic design.

16. The computer implemented method of claim 15, in which the act of partitioning the physical design area at the lower hierarchical level comprises:
identifying or determining a total number of child nodes at the lower hierarchical level in a parent cell of the multiple cells at the higher hierarchical level;
adding the total number of child nodes to the physical design area; and
determining the plurality of cells based at least in part upon the total number of child nodes.

17. The computer implemented method of claim 16, in which the act of adding the total number of child nodes comprises:
distributing the total number of child nodes based at least in part upon one or more geometric characteristic of the parent cell.

18. The computer implemented method of claim 16, in which the act of partitioning the physical design area at the lower hierarchical level comprises:
deriving or determining one or more models for moving the total number of child nodes at the lower hierarchical level from one or more corresponding models for moving a parent node of the parent cell.

19. The computer implemented method of claim 16, in which the act of partitioning the physical design area at the lower hierarchical level comprises:
reconfiguring the conductivity information at the lower hierarchical level by removing connectivity between two child nodes of the total number of child nodes; and
modifying the plurality of cells at the lower hierarchical level based at least in part upon reconfigured conductivity information at the lower hierarchical level.

20. An article of manufacture comprising a non-transitory computer readable storage medium storing thereupon a sequence of instructions which, when executed by at least one processor or at least one processor core, causes the at least one processor or the at least one processor core to perform a method for implementing physical design decomposition with custom conductivity, the method comprising:
at least one processor performing a process, the process comprising:
identifying incomplete conductivity information of an electronic design, wherein
the incomplete conductivity information includes no information for connecting at least a part of a first cell in the electronic design with another part of the electronic design;
partitioning a physical design area into multiple cells having a same number of nodes as a total number of cells in the multiple cells; and
iteratively moving at least some of the same number of nodes to generate a floorplan or a placement layout for the electronic design until the multiple cells satisfy one or more criteria.

21. The article of manufacture of claim 20, in which the process further comprises:
inferring conductivity information that is more complete than the incomplete conductivity based at least in part upon the multiple cells;
reconfiguring the conductivity information by removing connectivity between two nodes of the same number of nodes; and
repartitioning the physical design area based at least in part upon reconfigured conductivity information.

22. The article of manufacture of claim 21, in which the process further comprises:
determining a degree for the same number of nodes;
identifying a cell of the multiple cells that includes a first node and exhibits a first degree higher than the degree;
identifying a number of edges of the cell, wherein the number is equal to the degree; and
removing connectivity between the first node and one or more nodes corresponding to one or more edges of the cell that do not belong to the number of edges identified.

23. The article of manufacture of claim 22, in which the act of identify the number of edges of the cell comprises:
identifying a total number of edges of the cell;
sorting the total number of edges of the cell based at least in part on lengths of the total number of edges; and
selecting a first number of edges from the total number of edges that has been sorted, wherein the first number is equal to the number.

24. The article of manufacture of claim 20, in which the process further comprises:
generating a graph by using the multiple cells as vertices in the graph and at least the conductivity information to create edges between connected vertices; and partitioning the physical design area at a lower hierarchical level into a plurality of cells based at least in part on the multiple cells at a higher hierarchical level of the electronic design, in which the act of partitioning the physical design area is performed at the higher hierarchical level of the electronic design.

25. The article of manufacture of claim 24, in which the act of partitioning the physical design area at the lower hierarchical level comprises:
identifying or determining a total number of child nodes at the lower hierarchical level in a parent cell of the multiple cells at the higher hierarchical level;
adding the total number of child nodes to the physical design area; and
determining the plurality of cells based at least in part upon the total number of child nodes.

26. A system for using virtual sales process engineering, comprising:
a computing system that comprises at least one processor having at least one core and is to:
identify incomplete conductivity information of an electronic design, wherein
the incomplete conductivity information includes no information for connecting at least a part of a first cell in the electronic design with another part of the electronic design;
partition a physical design area into multiple cells having a same number of nodes as a total number of cells in the multiple cells; and
iteratively move at least some of the same number of nodes to generate a floorplan or a placement layout for the electronic design until the multiple cells satisfy one or more criteria.

27. The system of claim 26, in which the computing system is further to:
infer conductivity information that is more complete than the incomplete conductivity based at least in part upon the multiple cells;
reconfigure the conductivity information by removing connectivity between two nodes of the same number of nodes; and
reparation the physical design area based at least in part upon reconfigured conductivity information.

28. The system of claim 27, in which the computing system is further to:
determine a degree for the same number of nodes;
identify a cell of the multiple cells that includes a first node and exhibits a first degree higher than the degree;
identify a number of edges of the cell, wherein the number is equal to the degree; and
remove connectivity between the first node and one or more nodes corresponding to one or more edges of the cell that do not belong to the number of edges identified.

29. The system of claim 28, in which the computing system that is to identify the number of edges of the cell is further to:
identify a total number of edges of the cell;
sort the total number of edges of the cell based at least in part on lengths of the total number of edges; and
select a first number of edges from the total number of edges that has been sorted, wherein the first number is equal to the number.

30. The system of claim 26, in which the computing system is further to:
generate a graph by using the multiple cells as vertices in the graph and at least the conductivity information to create edges between connected vertices; and
partition the physical design area at a lower hierarchical level into a plurality of cells based at least in part on the multiple cells at a higher hierarchical level of the electronic design, in which the act of partitioning the physical design area is performed at the higher hierarchical level of the electronic design.

31. The system of claim 30, in which the computing system that is to partition the physical design area at the lower hierarchical level is further to:
identify or determine a total number of child nodes at the lower hierarchical level in a parent cell of the multiple cells at the higher hierarchical level;
add the total number of child nodes to the physical design area; and
determine the plurality of cells based at least in part upon the total number of child nodes.

* * * * *